(12) United States Patent
Song et al.

(10) Patent No.: US 9,806,075 B2
(45) Date of Patent: *Oct. 31, 2017

(54) INTEGRATED CIRCUIT DEVICES HAVING A FIN-TYPE ACTIVE REGION AND METHODS OF MANUFACTURING THE SAME

(71) Applicant: Samsung Electronics Co., Ltd., Suwon-si, Gyeonggi-do (KR)

(72) Inventors: Jae-yeol Song, Seoul (KR); Wan-don Kim, Yongin-si (KR); Oh-seong Kwon, Hwaseong-si (KR); Hyeok-jun Son, Seoul (KR); Sang-jin Hyun, Hwaseong-si (KR); Hoon-joo Na, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/001,283

(22) Filed: Jan. 20, 2016

(65) Prior Publication Data

US 2016/0315080 A1 Oct. 27, 2016

(30) Foreign Application Priority Data

Apr. 23, 2015 (KR) .................. 10-2015-0057536

(51) Int. Cl.
*H01L 27/088* (2006.01)
*H01L 29/06* (2006.01)
*H01L 21/8234* (2006.01)

(52) U.S. Cl.
CPC .... *H01L 27/0886* (2013.01); *H01L 21/82345* (2013.01); *H01L 21/823431* (2013.01); *H01L 21/823462* (2013.01); *H01L 29/0653* (2013.01)

(58) Field of Classification Search
None
See application file for complete search history.

(56) References Cited

U.S. PATENT DOCUMENTS 8,313,994 B2   11/2012   Clark
8,659,006 B1   2/2014    Chang et al.
(Continued)

FOREIGN PATENT DOCUMENTS

KR   10-2012-0215017   11/2012

*Primary Examiner* — William Coleman
*Assistant Examiner* — Kien Ly
(74) *Attorney, Agent, or Firm* — Ward and Smith, P.A.

(57) ABSTRACT

Integrated circuit devices include a substrate including first and second fin-type active regions and first and second gate structures. The first gate structure includes first gate insulating layer on the first fin-type active region to cover upper surface and both side surfaces of the first fin-type active region, first gate electrode on the first gate insulating layer and has first thickness in first direction perpendicular to upper surface of the substrate, and second gate electrode on the first gate electrode. The second gate structure includes second gate insulating layer on the second fin-type active region to cover upper surface and both side surfaces of the second fin-type active region, third gate insulating layer on the second gate insulating layer, third gate electrode on the third gate insulating layer and has second thickness different from the first thickness in the first direction, and fourth gate electrode on the third gate electrode.

20 Claims, 32 Drawing Sheets

(56) References Cited

U.S. PATENT DOCUMENTS

| | | | |
|---|---|---|---|
| 8,669,615 B1 | 3/2014 | Chang et al. | |
| 8,729,633 B2 | 5/2014 | Li | |
| 8,748,302 B2 | 6/2014 | Prindle et al. | |
| 8,932,949 B2 | 1/2015 | Cartier et al. | |
| 2012/0061773 A1* | 3/2012 | Tsuchiya | H01L 21/28167 257/411 |
| 2012/0261761 A1* | 10/2012 | Wang | H01L 21/82385 257/368 |
| 2012/0280330 A1 | 11/2012 | Lee et al. | |
| 2013/0277743 A1 | 10/2013 | Jagannathan et al. | |
| 2013/0277766 A1 | 10/2013 | Kelwing et al. | |
| 2013/0299922 A1* | 11/2013 | Choi | H01L 21/82345 257/412 |
| 2014/0001570 A1 | 1/2014 | Brodsky et al. | |
| 2014/0027859 A1 | 1/2014 | Gerhardt et al. | |
| 2014/0054717 A1 | 2/2014 | Edge et al. | |
| 2014/0217479 A1 | 8/2014 | Colinge et al. | |
| 2014/0239407 A1 | 8/2014 | Manabe et al. | |
| 2014/0319623 A1* | 10/2014 | Tsai | H01L 21/82346 257/401 |
| 2015/0035073 A1* | 2/2015 | Ando | H01L 21/28229 257/369 |
| 2015/0126023 A1* | 5/2015 | Choi | H01L 21/28158 438/591 |
| 2016/0049335 A1* | 2/2016 | Liu | H01L 21/82343 438/283 |
| 2016/0064378 A1* | 3/2016 | Kwon | H01L 21/82345 257/401 |
| 2016/0093535 A1* | 3/2016 | Xu | H01L 21/02244 257/392 |

* cited by examiner

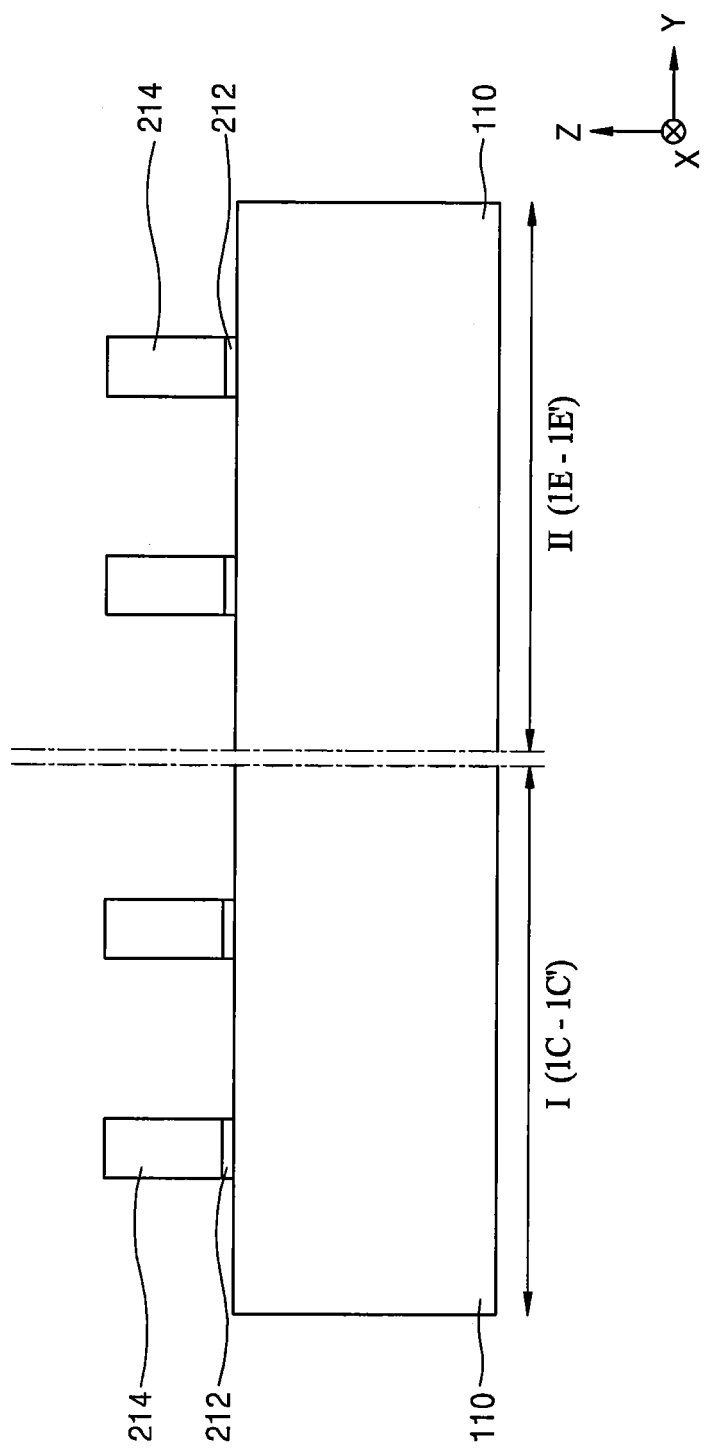

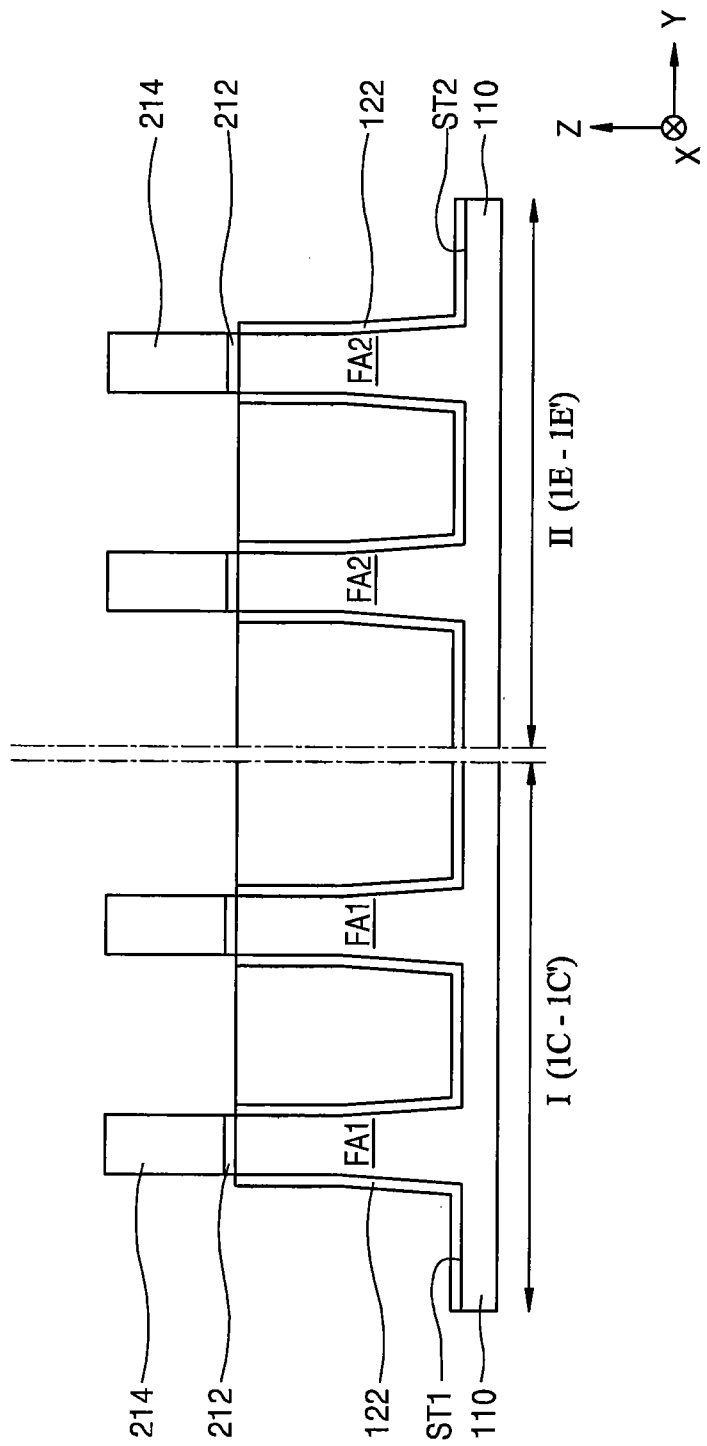

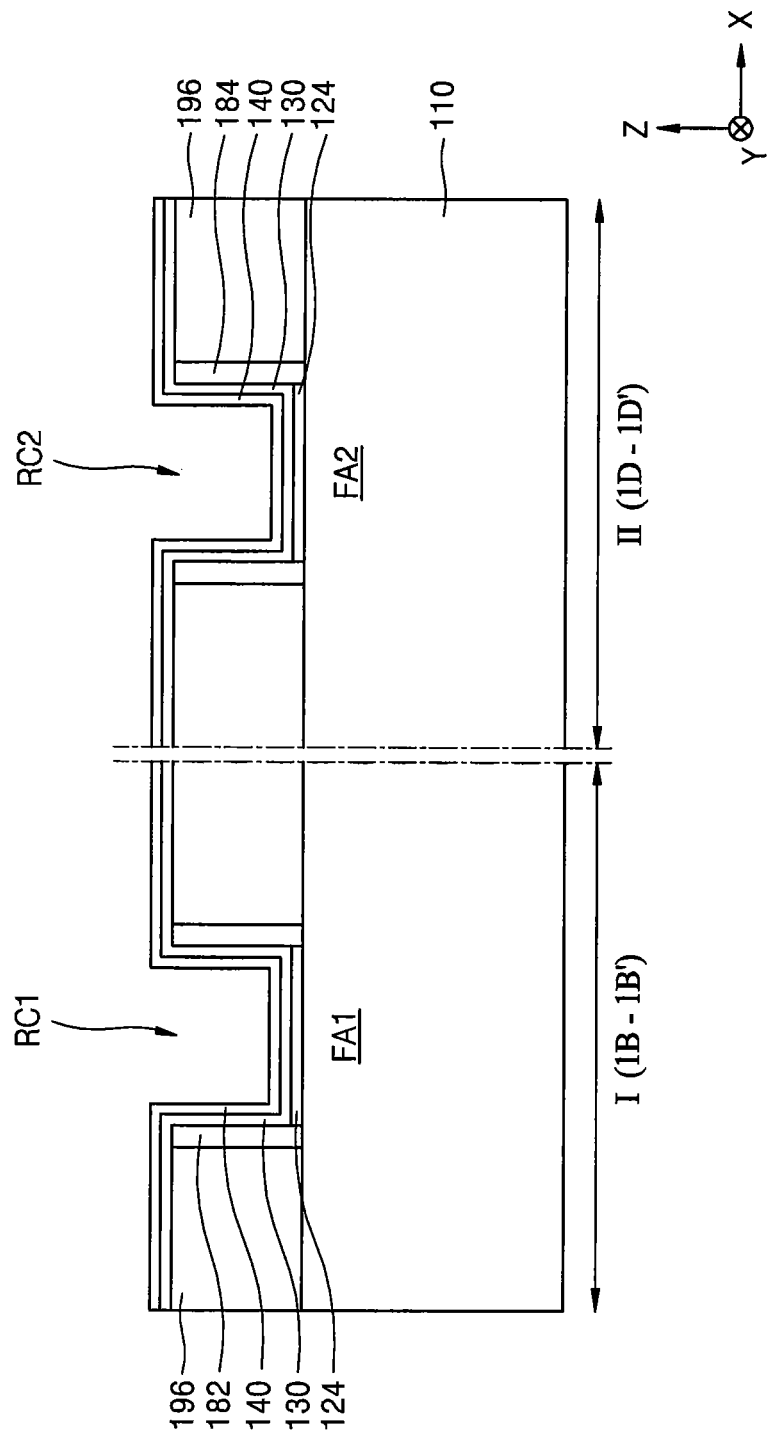

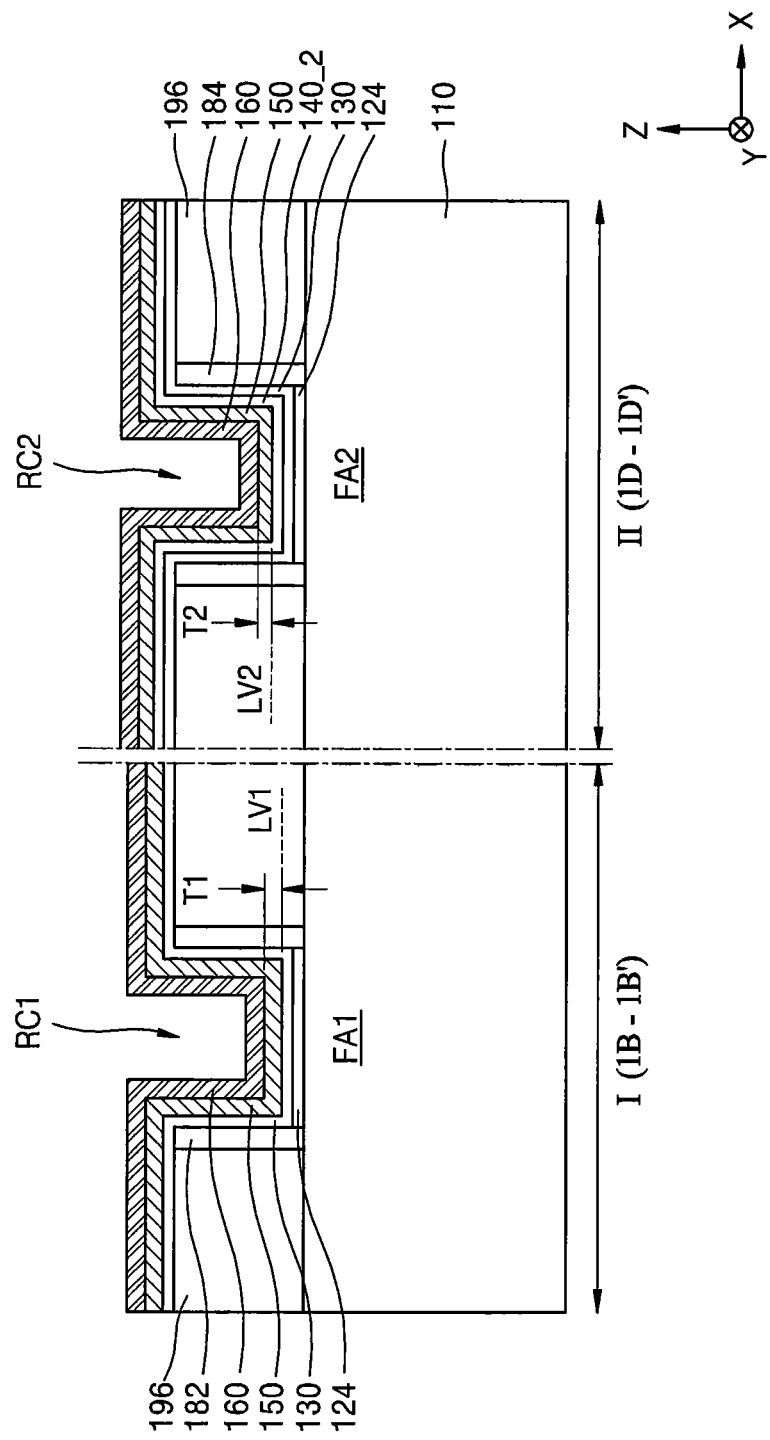

INTEGRATED CIRCUIT DEVICES HAVING A FIN-TYPE ACTIVE REGION AND METHODS OF MANUFACTURING THE SAME

CROSS-REFERENCE TO RELATED APPLICATION

This application claims the benefit of Korean Patent Application No. 10-2015-0057536, filed on Apr. 23, 2015, in the Korean Intellectual Property Office, the content of which is hereby incorporated herein by reference as if set forth in its entirety.

FIELD

The inventive concept relates to an integrated circuit device and a method of manufacturing the same, and more particularly, to an integrated circuit device including a fin field-effect transistor (FinFET) and a method of manufacturing the same.

BACKGROUND

In order to realize a high-speed operation of an electronic apparatus, a semiconductor device included in the electronic apparatus has been miniaturized. One of the technologies for miniaturizing the semiconductor device is a fin field-effect transistor in which gates are formed on fins protruding from a substrate and the fins are used as three-dimensional channels.

SUMMARY

The inventive concept provides an integrated circuit device having a plurality of threshold voltages.

The inventive concept provides a method of manufacturing the integrated circuit device.

According to an aspect of the inventive concept, there is provided an integrated circuit device including: a substrate including first and second fin-type active regions; a first gate structure formed on the first fin-type active region, and including a first gate insulating layer on an upper surface and both side surfaces of the first fin-type active region, a first gate electrode on the first gate insulating layer and the first gate having a first thickness in a first direction perpendicular to an upper surface of the substrate, and a second gate electrode on the first gate electrode; and a second gate structure on the second fin-type active region, and including a second gate insulating layer that covers an upper surface and both side surfaces of the second fin-type active region, a third gate insulating layer on the second gate insulating layer, a third gate electrode on the third gate insulating layer, the third gate electrode having a second thickness that is different from the first thickness in the first direction, and a fourth gate electrode on the third gate electrode.

A material of the first gate insulating layer may be different from a material of the third gate insulating layer.

A difference between the first thickness of the first gate electrode and the second thickness of the third gate electrode may be in the range of about 0.1 nm to about 1 nm.

The first gate electrode may include substantially the same material as the third gate electrode.

The second thickness of the third gate electrode may be less than the first thickness of the first gate electrode.

The material of the first gate electrode may be different from a material of the third gate electrode, the first gate electrode may include a first conductive material that has a first impurity, the first impurity including a first component element forming the first gate insulating layer, and the third gate electrode may include a second conductive material that has a second impurity, the second impurity including a second component element forming the third gate insulating layer.

The first gate structure may further include a first barrier metal layer between the first gate electrode and the second gate electrode, and the second gate structure may further include a second barrier metal layer between the third gate electrode and the fourth gate electrode.

The second thickness of the third gate electrode may be greater than the first thickness of the first gate electrode.

The first fin-type active region may be a region for forming a first NMOS transistor having a first threshold voltage, and the second fin-type active region may be a region for forming a second NMOS transistor having a second threshold voltage that is different from the first threshold voltage.

The first and second fin-type active regions may extend in a second direction parallel to the upper surface of the substrate, the first and second gate structures may extend in a third direction parallel to the upper surface of the substrate and different from the second direction, and the integrated circuit device may further include: a first dummy gate structure that is spaced apart from the first gate structure on the first fin-type active region and extends in the third direction; and a second dummy gate structure that is spaced apart from the second gate structure on the second fin-type active region and extends in the third direction.

According to another aspect of the inventive concept, there is provided an integrated circuit device including: a substrate including first and second fin-type active regions; isolation layers that are formed on the substrate and partially cover lower portions of the first and second fin-type active regions; a pair of first spacers and a pair of second spacers that extend on the isolation layers and the substrate to respectively intersect with the first fin-type active region and the second fin-type active region; a first gate structure that covers an upper surface and both side surfaces of the first fin-type active region in a space between the pair of first spacers; and a second gate structure that covers an upper surface and both side surfaces of the second fin-type active region in a space between the pair of second spacers, wherein the first gate structure includes a first gate electrode having a first thickness in a first direction perpendicular to an upper surface of the substrate, and the second gate structure includes a third gate electrode having a second thickness that is different from the first thickness in the first direction.

The first gate structure may include: a first gate insulating layer that covers at least portions of opposite side surfaces of the pair of first spacers and the upper surface and both side surfaces of the first fin-type active region at a predetermined thickness in the space between the pair of first spacers; a first gate electrode that extends on the first gate insulating layer to cover the at least portions of the opposite side surfaces of the pair of first spacers and the upper surface and both side surfaces of the first fin-type active region; a second gate electrode that extends on the first gate electrode to cover the at least portions of the opposite side surfaces of the pair of first spacers and the upper surface and both side surfaces of the first fin-type active region and defines a first recess space; and a first gap-filling metal layer that extends on the second gate electrode to fill the first recess space, and the second gate structure may include: a second gate insulating layer that covers at least portions of opposite side surfaces of the pair of second spacers and the upper surface and both side surfaces of the second fin-type active region at a predetermined thickness in the space between the pair of second spacers; a third gate insulating layer that extends on the second gate insulating layer to cover the at least portions of the opposite side surfaces of the pair of second spacers and the upper surface and both side surfaces of the second fin-type active region; a third gate electrode that extends on the third gate insulating layer to cover the at least portions of the opposite side surfaces of the pair of second spacers and the upper surface and both side surfaces of the second fin-type active region; a fourth gate electrode that extends on the third gate electrode to cover the at least portions of the opposite side surfaces of the pair of second spacers and the upper surface and both side surfaces of the second fin-type active region and defines a second recess space; and a second gap-filling metal layer that extends on the fourth gate electrode to fill the second recess space.

The first gate insulating layer may include substantially the same material as the second gate insulating layer, and a material of the first gate insulating layer may be different from a material of the third gate insulating layer.

A bottom surface of the first gate electrode may be disposed at a level lower than a level of a bottom surface of the third gate electrode, the bottom surface of the first gate electrode vertically overlapping the upper surface of the first fin-type active region, and the bottom surface of the third gate electrode vertically overlapping the upper surface of the second fin-type active region.

A bottom surface of the first gate electrode may be in contact with an upper surface of the first gate insulating layer, and a bottom surface of the third gate electrode may be in contact with an upper surface of the third gate insulating layer.

According to another aspect of the inventive concept, there is provided an integrated circuit device including: a substrate including first and second fin-type active regions; a first gate structure formed on the first fin-type active region, and including a first gate insulating layer that covers an upper surface and both side surfaces of the first fin-type active region, and a first gate electrode on the first gate insulating layer and has a first thickness in a first direction perpendicular to an upper surface of the substrate; and a second gate structure formed on the second fin-type active region, and including a second gate insulating layer that covers an upper surface and both side surfaces of the second fin-type active region, a third gate insulating layer that covers the upper surface and both side surfaces of the second fin-type active region with the second gate insulating layer disposed therebetween, and a third gate electrode on the third gate insulating layer and has a second thickness that is different from the first thickness in the first direction.

A difference between the first thickness of the first gate electrode and the second thickness of the third gate electrode may be in the range of about 0.1 nm to about 1 nm.

The first gate electrode may comprise substantially the same material as the third gate electrode, or the first gate electrode may comprise a material different from that of the third gate electrode.

A bottom surface of the first gate electrode may be disposed at a level lower than a level of a bottom surface of the third gate electrode.

The first gate electrode may comprise a first conductive material that has a first impurity and the first impurity may include a first component element forming the first gate insulating layer, and the third gate electrode may comprise a second conductive material that has a second impurity and the second impurity may include a second component element forming the third gate insulating layer.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1A:
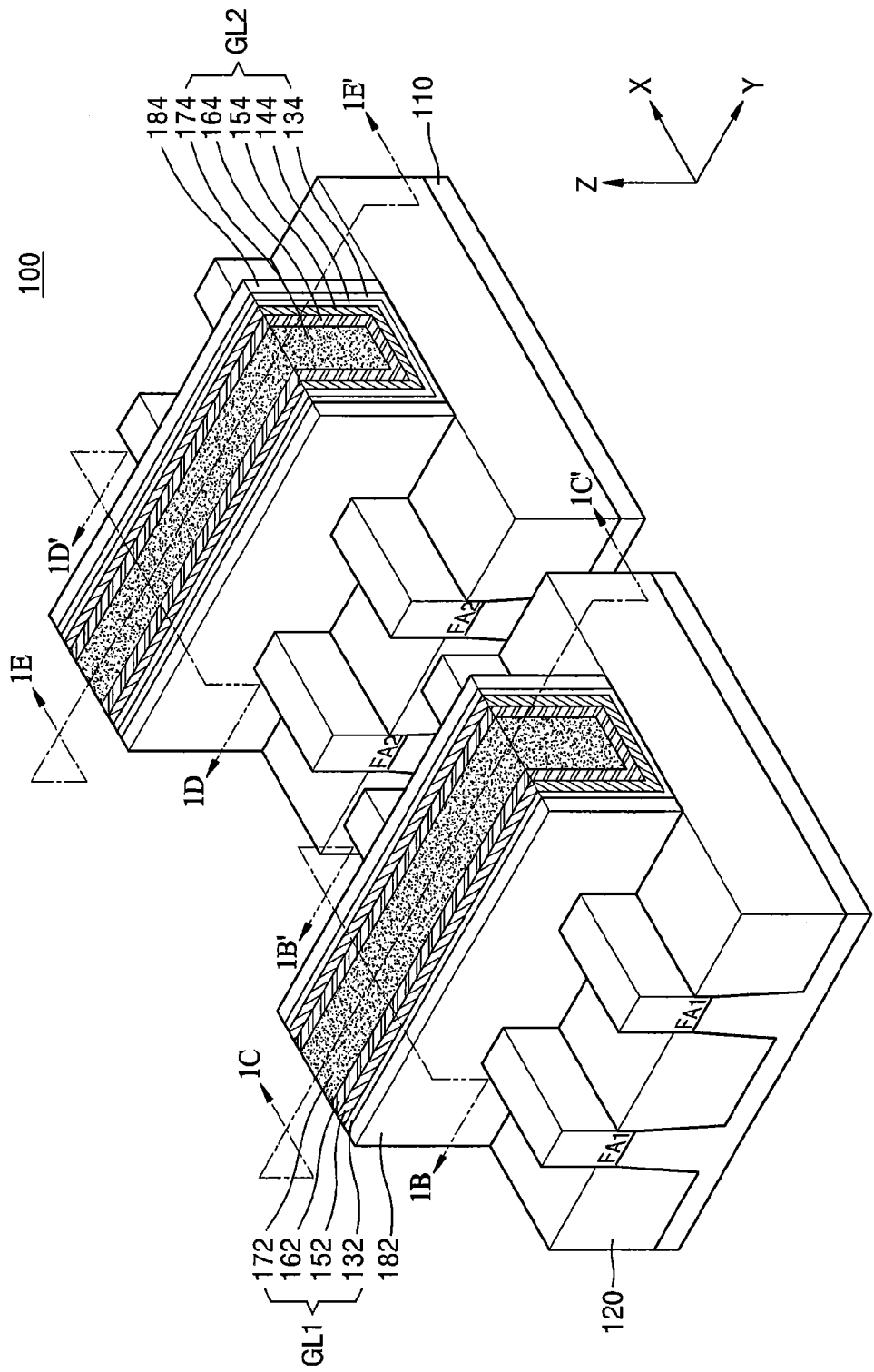
FIG. 1A is a perspective view of an integrated circuit device according to exemplary embodiments.

The inventive concept may, however, be embodied in many different forms and should not be construed as being limited to the exemplary embodiments set forth herein; rather, these exemplary embodiments are provided so that this disclosure will be thorough and complete, and will fully convey the inventive concept to one of ordinary skill in the art. It should be understood, however, that there is no intent to limit the inventive concept to the particular forms disclosed, but on the contrary, the inventive concept is to cover all modifications, equivalents, and alternatives falling within the spirit and scope of the inventive concept. Like reference numerals denote like elements throughout the specification and drawings. In the drawings, the dimensions of structures are exaggerated for clarity of the inventive concept. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present.

It will be understood that, although the terms "first", "second", "third", etc. may be used herein to describe various elements, these elements should not be limited by these terms. These terms are only used to distinguish one element from another. For example, a first element may be referred to as a second element, and similarly, a second element may be referred to as a first element without departing from the scope of protection of the inventive concept.

As used herein, the singular forms "a", "an", and "the" are intended to include the plural forms as well, unless the context clearly indicates otherwise. It will be understood that terms such as "comprise", "include", and "have", when used herein, specify the presence of stated features, integers, steps, operations, elements, components, or combinations thereof, but do not preclude the presence or addition of one or more other features, integers, steps, operations, elements, components, or combinations thereof.

Unless otherwise defined, all terms used herein have the same meaning as commonly understood by one of ordinary skill in the art to which this inventive concept belongs. Hereinafter, exemplary embodiments of the inventive concept will be described in detail with reference to the accompanying drawings.

Figure 1B:
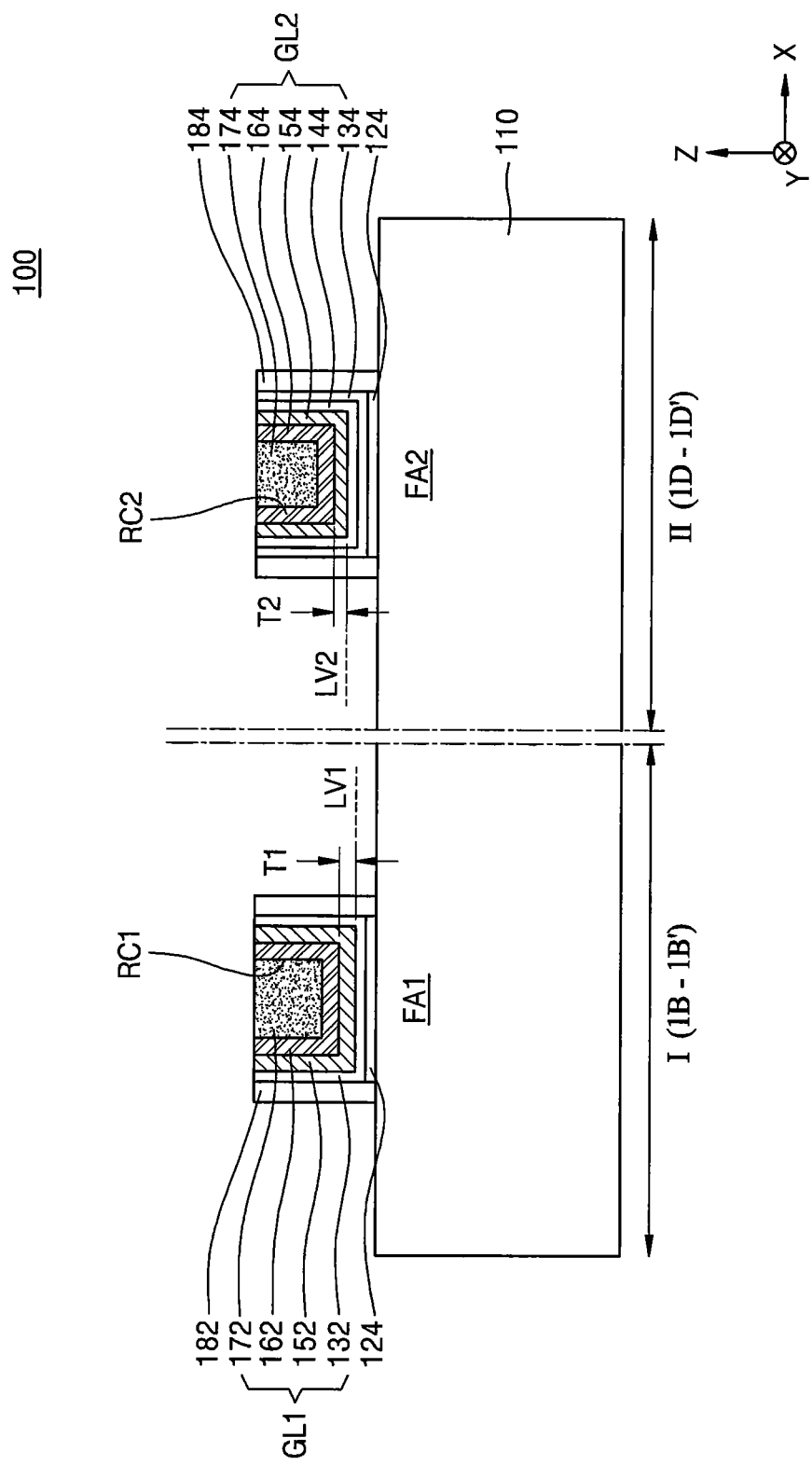
FIG. 1B is a cross-sectional view taken along line 1B-1B' and line 1D-1D' of FIG. 1A.
Figure 1C:
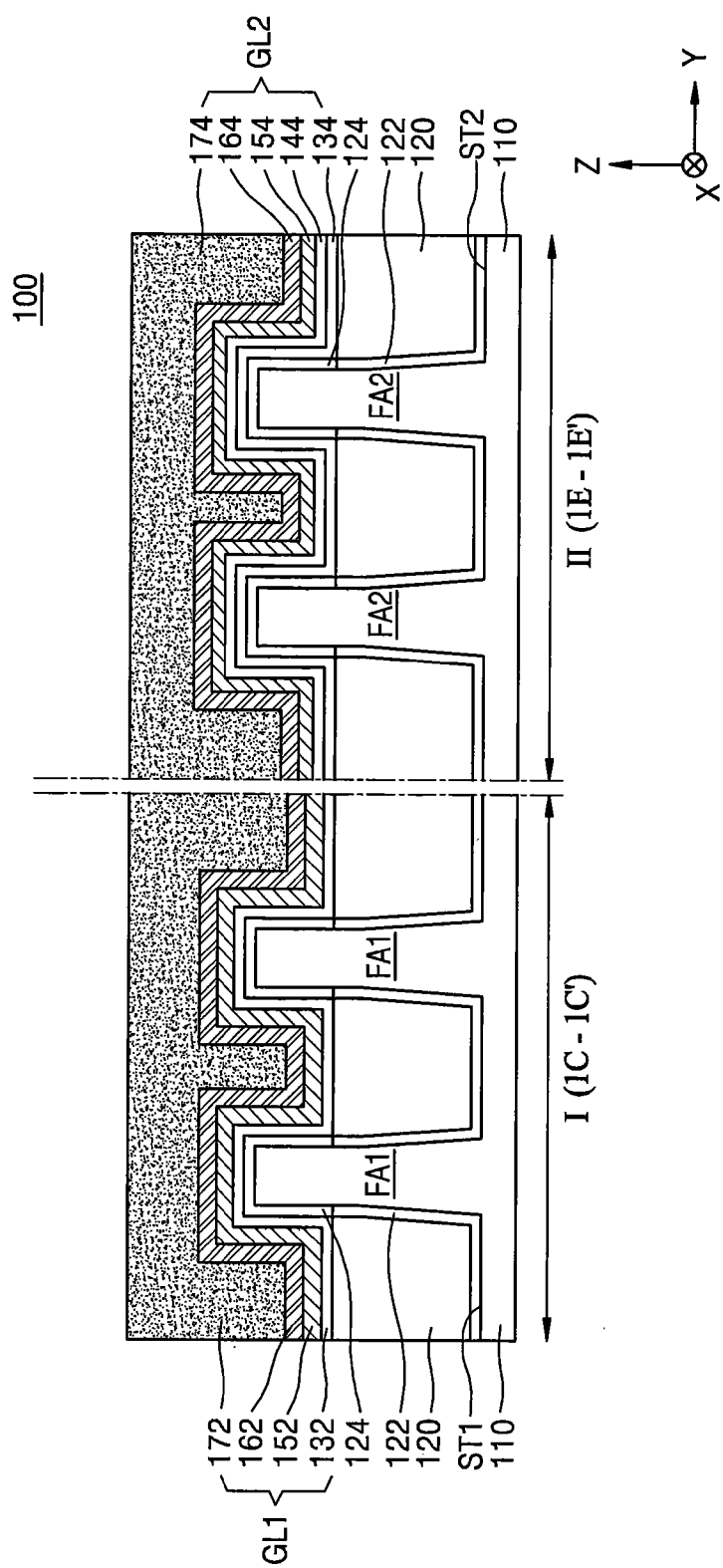
FIG. 1C is a cross-sectional view taken along line 1C-1C' and 1E-1E' of FIG. 1A.

FIGS. 1A to 1C are views of an integrated circuit device 100 according to exemplary embodiments. FIG. 1A is a perspective view of the integrated circuit device 100, FIG. 2B is a cross-sectional view taken along line 1B-1B' and line 1D-1D' of FIG. 1A, and FIG. 1C is a cross-sectional view taken along line 1C-1C' and 1E-1E' of FIG. 1A.

Referring to FIGS. 1A to 1C, the integrated circuit device 100 may include a substrate 110 defining a first region I and a second region II. In some example embodiments, the substrate 110 may be a semiconductor substrate including a semiconductor material such as silicon, germanium, silicon germanium, silicon carbide, gallium arsenide, indium arsenide, or indium phosphide. In some example embodiments, the substrate 110 may have a silicon-on-insulator (SOI) structure. For example, the substrate 110 may include a buried oxide layer (BOX layer). The substrate 110 may include a conductive region, for example, an impurity-doped well or an impurity-doped structure.

The first and second regions I and II of the substrate 110 may be regions for forming transistors respectively having different threshold voltages. In some example embodiments, the first region I may be a region for forming a first NMOS transistor having a first threshold voltage, and the second region II may be a region for forming a second NMOS transistor having a second threshold voltage. In some example embodiments, the first region I may be a region for forming a first PMOS having the first threshold voltage, and the second region II may be a region for forming a second PMOS transistor having the second threshold voltage. However, the first and second regions I and II are not limited thereto. The first region I may be a region for forming the first NMOS transistor having the first threshold voltage, and the second region II may be a region for forming the second PMOS transistor having the second threshold voltage.

First fin-type active regions FA1 and second fin-type active regions FA2 may be formed in the first region I and the second region II of the substrate 110, respectively. The first and second fin-type active regions FA1 and FA2 may protrude from the substrate 110 in a Z-direction perpendicular to a main surface of the substrate 110 and may extend in an X-direction parallel to the main surface of the substrate 110. First trenches ST1 and second trenches ST2 may be formed in both sidewalls of the first fin-type active regions FA1 and both sidewalls of the second fin-type active regions FA2, respectively. The first and second trenches ST1 and ST2 may extend in the X-direction.

Isolation layers 120 may be formed in the first and second trenches ST1 and ST2. The isolation layers 120 may partially cover lower portions of the first and second fin-type active regions FA1 and FA2. Upper surfaces of the isolation layers 120 may be at a lower level than a level of upper surfaces of the first and second fin-type active regions FA1 and FA2. Therefore, the upper surfaces and both side surfaces of the first and second fin-type active regions FA1 and FA2 may not be covered by the isolation layers 120. The isolation layers 120 may include oxide layers formed through a flowable chemical vapor deposition (FCVD) process or a spin coating process. For example, the isolation layers 120 may include at least one selected from the group consisting of fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), and tonen silazene (TOSZ). The selected material of the isolation layers 120 is not limited thereto.

Optionally, insulating liners 122 may be further formed between the first and second fin-type active regions FA1 and FA2 and the isolation layers 120. In some example embodiments, the insulating liners 122 may be conformally formed on sidewalls and bottoms of the first and second trenches ST1 and ST2. For example, the insulating liners 122 may have a thickness of about 10 Å to about 100 Å, but the thickness of the insulating liners 122 is not limited thereto. In some example embodiments, the insulating liners 122 may include oxide layers formed through an oxidation process of oxidizing surfaces of the first and second fin-type active regions FA1 and FA2, which are exposed by the first and second trenches ST1 and ST2. The oxidation process may be, for example, an in-situ steam generation (ISSG) process, a heat oxidation process, a UV oxidation process, or an $O_2$ plasma oxidation process.

Deep trenches (not illustrated) may be further formed in the substrate 110. The deep trenches may have a predetermined depth from the upper surfaces of the first and second fin-type active regions FA1 and FA2. Field insulating layers (not illustrated) may be further formed to fill the deep trenches.

A first gate structure GL1 may be formed on the first fin-type active regions FA1 and the isolation layers 120 to cover the upper surfaces and both sides of the first fin-type active regions FA1. The first gate structure GL1 may extend in a direction (for example, a Y-direction) intersecting with the extension direction of the first fin-type active regions FA1. In addition, a pair of first spacers 182 may be formed on both sides of the first gate structure GL1. The pair of first spacers 182 may extend on the first fin-type active regions FA1 and the isolation layers 120 in a direction (for example, the Y-direction) intersecting with the extension direction of the first fin-type active regions FA1.

The first gate structure GL1 may include a first gate insulating layer 132, a first gate electrode 152, a second gate electrode 162, and a first gap-filling metal layer 172, which are sequentially stacked on the first fin-type active regions FA1 and the isolation layers 120.

The first gate insulating layer 132 may cover at least portions of opposite side surfaces of the pair of first spacers 182 and the upper surfaces and both side surfaces of the first fin-type active regions FA1 at a uniform thickness in a space between the pair of first spacers 182.

In some example embodiments, the first gate insulating layer 132 may include one selected from the group consisting of a silicon oxide layer, a high-dielectric-constant (high-k) layer, and any combinations thereof. The high-k layer may include a material having a dielectric constant greater than a dielectric constant of the silicon oxide layer. For example, the first gate insulating layer 132 may have a dielectric constant of about 7 to about 25. In some example embodiments, the high-k layer may include silicon oxynitride or at least one selected from the group consisting of oxides, oxynitrides, silicates, and silicon oxides of hafnium (Hf), zirconium (Zr), titanium (Ti), tantalum (Ta), niobium (Nb), aluminium (Al), magnesium (Mg), calcium (Ca), strontium (St), scandium (Sc), yttrium (Y), lanthanum (La), and a lanthanoid element. For example, the high-k layer may include one selected from the group consisting of hafnium oxide, hafnium oxynitride, hafnium silicon oxide, lanthanum oxide, lanthanum aluminium oxide, zirconium oxide, zirconium silicon oxide, tantalum oxide, titanium oxide, barium strontium titanium oxide, barium titanium oxide, strontium titanium oxide, yttrium oxide, aluminium oxide, magnesium oxide, calcium oxide, lead scandium tantalum oxide, lead zinc niobate, and any combinations thereof. However, the selected material of the high-k layer is not limited thereto. In some example embodiments, the first gate insulating layer 132 may be formed through an atomic layer deposition (ALD) process, a chemical vapor deposition (CVD) process, or a physical vapor deposition (PVD) process.

The first gate electrode 152 may cover the at least portions of the opposite side surfaces of the pair of first spacers 182 and the upper surfaces and both side surfaces of the first fin-type active regions FA1 at a uniform thickness in the space between the pair of first spacers 182. A bottom surface of the first gate electrode 152 may come into contact with an upper surface of the first gate insulating layer 132.

In some example embodiments, the first gate electrode 152 may include at least one selected from the group consisting of metal nitride, metal carbide, metal silicide, metal silicon nitride, and metal silicon carbide, each of which includes titanium (Ti) and tantalum (Ta) solely or in combination. The first gate electrode 152 may be formed through an ALD process, a metal organic ALD (MOALD) process, or a metal organic CVD (MOCVD) process.

The first gate electrode 152 may have a first thickness T1 in the Z-direction perpendicular to the upper surface of the substrate 110. For example, the first thickness T1 of the first gate electrode 152 may be in the range of about 2 nm to about 50 nm. However, the first thickness T1 of the first gate electrode 152 is not limited thereto.

The second gate electrode 162 may extend on the first gate electrode 152 to cover the at least portions of the opposite side surfaces of the pair of first spacers 182 and the upper surfaces and both side surfaces of the first fin-type active regions FA1. The second gate electrode 162 may define a first recess space RC1 between the pair of first spacers 182.

In some example embodiments, the second gate electrode 162 may be a metal-containing layer for adjusting a work function. For example, the second gate electrode 162 may include at least one selected from the group consisting of titanium (Ti), tantalum (Ta), tungsten (W), ruthenium (Ru), niobium (Nb), molybdenum (Mo), aluminium (Al), hafnium (Hf), nickel (Ni), cobalt (Co), platinum (Pt), ytterbium (Yb), terbium (Tb), dysprosium (Dy), erbium (Er), and palladium (Pd).

The first gap-filling metal layer 172 may extend in the Y-direction on the second gate electrode 162 to fill the first recess space RC1. For example, the first gap-filling metal layer 172 may include a tungsten (W) layer. The first gap-filling layer 172 may be formed through an ALD process, a CVD process, or a PVD process. The first gap-filling metal layer 172 may fill the first recess space RC1 without voids. The first recess space RC1 may be defined by stepped portions on the upper surface of the second gate electrode 162.

A second gate structure GL2 may be formed on the second fin-type active regions FA2 and the isolation layers 120 to cover upper surfaces and both side surfaces of the second fin-type active regions FA2. The second gate structure GL2 may extend in a direction (for example, the Y-direction) intersecting with the extension direction of the second fin-type active regions FA2. In addition, a pair of second spacers 184 may be formed on both side surfaces of the second gate structure GL2. The pair of second spacers 184 may extend in the Y-direction.

The second gate structure GL2 may include a second gate insulating layer 134, a third gate insulating layer 144, a third gate electrode 154, and a fourth gate electrode 164, and a second gap-filling metal layer 174, which are sequentially stacked on the second fin-type active regions FA2 and the isolation layers 120.

The second gate insulating layer 134 may cover at least portions of opposite side surfaces of the pair of second spacers 184 and the upper surfaces and both side surfaces of the second fin-type active regions FA2 at a uniform thickness in a space between the pair of second spacers 184. The second gate insulating layer 134 may include substantially the same material as the first gate insulating layer 132. In some example embodiments, the second gate insulating layer 134 may be formed through substantially the same process as the first gate insulating layer 132. Accordingly, the second gate insulating layer 134 may include substantially the same material as the first gate insulating layer 132, but the inventive concept is not limited thereto.

The third gate insulating layer 144 may cover the at least portions of the opposite side surfaces of the pair of second spacers 184 and the upper surfaces and both side surfaces of the second fin-type active regions FA2 at a uniform thickness on the second gate insulating layer 134. The third gate insulating layer 144 may include one selected from the group consisting of a silicon oxide layer, a high-k layer, and any combinations thereof. The high-k layer may include a material having a dielectric constant greater than a dielectric constant of the silicon oxide layer. For example the third gate insulating layer 144 may have a dielectric constant of about 7 to about 25. In some example embodiments, the high-k layer may include at least one selected from the group consisting of oxides, oxynitrides, silicates, and silicon oxides of Hf, Zr, Ti, Ta, Nb, Al, Mg, Ca, St, Sc, Y, La, and a lanthanoid element.

In some example embodiments, a material of the third gate insulating layer 144 may be different from a material of the first gate insulating layer 132 or the second gate insulating layer 134. Here, the different material may mean that the first to third gate insulating layers 132 to 144 include different kinds of component elements or include different content of the component elements even when the component elements are the same kind. For example, the first gate insulating layer 132 or the second gate insulating layer 134 may include hafnium silicon oxide, and the third gate insulating layer 144 may include zirconium silicon oxide. In some example embodiments, the first and second gate insulating layers 132 and 134 may include hafnium silicon oxide, and the third gate insulating layer 144 may include hafnium silicon oxide nitride. In addition, all of the first to third gate insulating layers 132 to 144 may include hafnium silicon oxide and may include different content of hafnium or different content of silicon.

The third gate electrode 154 may cover the at least portions of the opposite side surfaces of the pair of second spacers 184 and the upper surfaces and both side surfaces of the second fin-type active regions FA2 at a uniform thickness on the third gate insulating layer 144. A bottom surface of the third gate electrode 154 may come into contact with an upper surface of the third gate insulating layer 144.

In some example embodiments, the third gate electrode 154 may include at least one selected from the group consisting of metal nitride, metal carbide, metal silicide, metal silicon nitride, and metal silicon carbide, each of which includes Ti and Ta solely or in combination. The third gate electrode 154 may be formed through an ALD process, an MOALD process, or an MOCVD process. For example, the third gate electrode 154 may include substantially the same material as the first gate electrode 152, but the inventive concept is not limited thereto.

The third gate electrode 154 may have a second thickness T2 in the Z-direction perpendicular to the upper surface of the substrate 110. For example, the second thickness T2 of the third gate electrode 154 may be in the range of about 2 nm to about 50 nm. However, the second thickness T2 of the third gate electrode 154 is not limited thereto.

The third gate electrode 154 may have the second thickness T2 in the Z-direction perpendicular to the upper surface of the substrate 110, and the second thickness T2 may be less than the first thickness T1 of the first gate electrode 152. In some example embodiments, the second thickness T2 may be less than the first thickness Ti by about 0.1 nm to about 1 nm. In addition, a lower level LV2 of the third gate electrode 154 may be higher than a lower level LV1 of the first gate electrode 152.

In some example embodiments, in the process of forming the first and third gate electrodes 152 and 154, the first and third electrodes 152 and 154 may be formed to have a thickness difference by adjusting growth rates (or deposition rates) of the first and third gate electrodes 152 and 154. Specifically, since the first and third gate electrodes 152 and 154 are formed on the first and third gate insulating layers 132 and 144, respectively, and the material of the first gate insulating layer 132 is different from the material of the third gate insulating layer 144, the growth rate of the first gate electrode 152 may be different from the growth rate of the third gate electrode 154. For example, the first and third gate electrodes 152 and 154 may have a thickness difference of about 1 nm or less.

The fourth gate electrode 164 may extend on the third gate electrode 154 to cover the at least portions of the opposite side surfaces of the pair of second spacers 184 and the upper surfaces and both side surfaces of the second fm-type active regions FA2. The fourth gate electrode 164 may define a second recess space RC2 between the pair of second spacers 184.

In some example embodiments, the fourth gate electrode 164 may be a layer including a metal for adjusting a work function. For example, the fourth gate electrode 164 may include at least one selected from the group consisting of Ti, Ta, W, Ru, Nb, Mo, Al, Hf, Ni, Co, Pt, Yb, Tb, Dy, Er, and Pd. The fourth gate electrode 164 may include substantially the same material as the second gate electrode 162, but the inventive concept is not limited thereto.

The second gap-filling metal layer 174 may extend in the Y-direction on the fourth gate electrode 164 to fill the second recess space RC2. The second gap-filling metal layer 174 may include substantially the same material as the first gap-filling metal layer 172, but the inventive concept is not limited thereto.

Optionally, interface layers 124 may be further formed between the first gate structure GL1 and the first fin-type active regions FA1 and between the second gate structure GL2 and the second fin-type active regions FA2. In some example embodiments, the interface layers 124 may be conformally formed on the side surfaces and upper surfaces of the first and second fm-type active regions FA1 and FA2. For example, the interface layers 124 may have a thickness of about 10 Å to about 100 Å, but the thickness of the interface layers 124 is not limited thereto. In some example embodiments, the interface layers 124 may include oxide layers formed through an oxidation process of oxidizing surfaces of the first and second fin-type active regions FA1 and FA2, and the oxidation process may be, for example, an in-situ steam generation (ISSG) process, a heat oxidation process, a UV oxidation process, or an $O_2$ plasma oxidation process.

Although not illustrated, source/drain regions may be formed in upper portions of the first and second fin-type active regions FA1 and FA2 at both sides of the first and second gate structures GL1 and GL2. For example, the source/drain regions may include semiconductor layers epitaxially grown from the first and second fin-type active regions FA1 and FA2. The source/drain regions may include an epitaxially grown Si layer, an epitaxially grown SiC layer, or an embedded SiGe structure including a plurality of epitaxially grown SiGe layers.

The integrated circuit device 100 described with reference to FIGS. 1A to 1C may include the first and second gate structures GL1 and GL2, which have different stacked structures from each other. Specifically, since the first and third gate electrodes 152 and 154 are formed on the first and third gate insulating layers 132 and 144, respectively, and the material of the first gate insulating layer 132 is different from the material of the third gate insulating layer 144, the growth rate of the first gate electrode 152 may be different from the growth rate of the third gate electrode 154. The first and third gate electrodes 152 and 154 may have a thickness difference of about 1 nm or less. An effective work function exerted on the first fin-type active regions FA1 by the second gate electrode 162 may be slightly different from an effective work function exerted on the second fin-type active regions FA2 by the fourth gate electrode 164. Therefore, the first and second gate structures GL1 and GL2 may constitute fin field-effect transistors having different threshold voltages.

Figure 2:
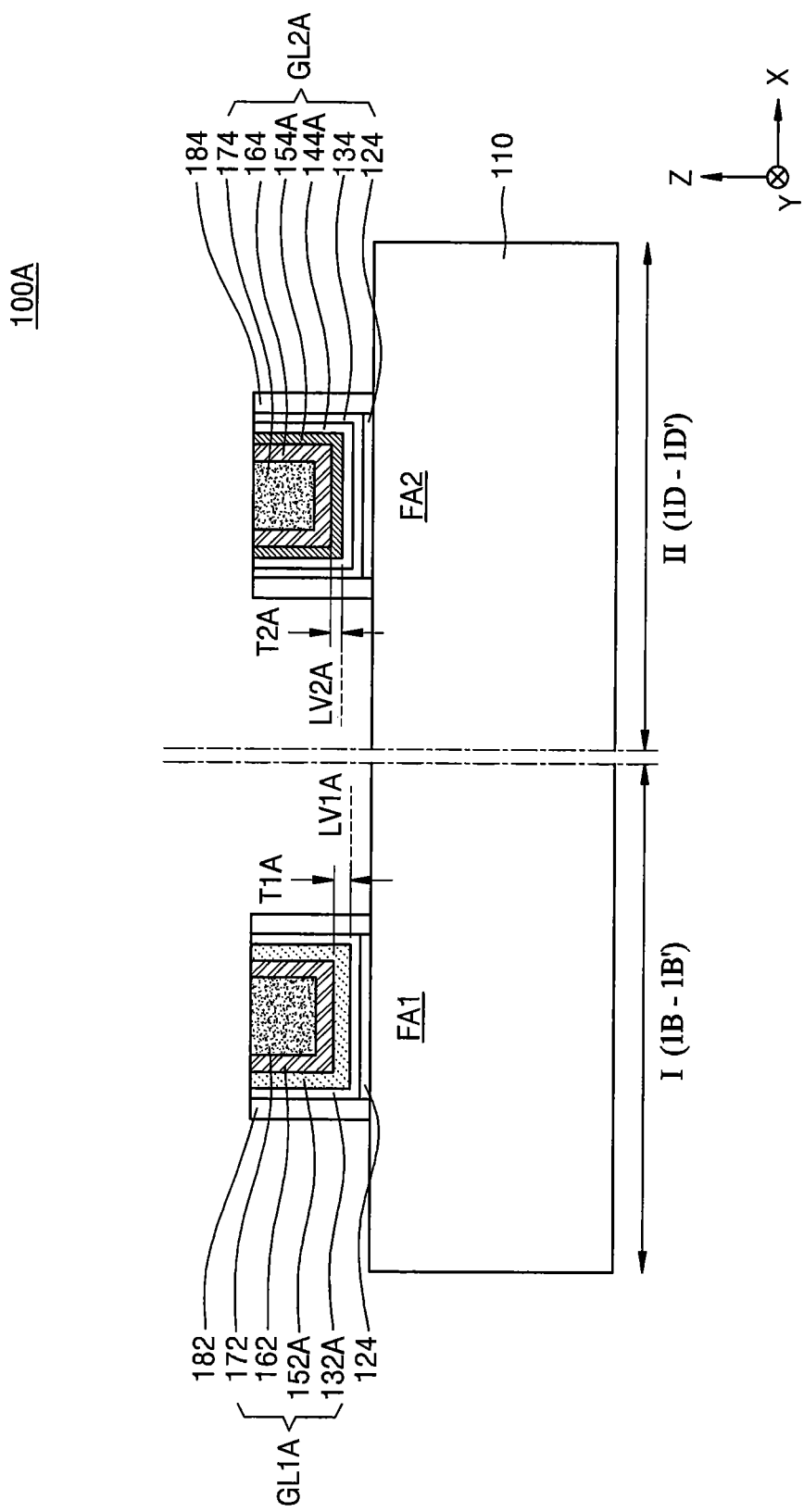
FIG. 2 is a cross-sectional view of an integrated circuit device according to some embodiments of the present inventive concept.

FIG. 2 is a cross-sectional view of an integrated circuit device 100A according to exemplary embodiments. FIG. 2 is a cross-sectional view taken along line 1B-1B' and line 1D-1D' of FIG. 1A. In FIG. 2, like reference numerals as used in FIGS. 1A to 1C refer to like elements, and detailed descriptions thereof will be omitted.

Referring to FIG. 2, a first gate structure GL1A may include a first gate electrode 152A formed on a first gate insulating layer 132A, and the first gate electrode 152A may have a first thickness T1A in a vertical direction (for example, a Z-direction). A second gate structure GL2A may include a third gate electrode 154A formed on a third gate insulating layer 144A, and the third gate electrode 154A may have a second thickness T2A that is less than the first thickness T1A in the vertical direction (for example, the Z-direction).

A material of the first gate electrode 152A may be different from a material of the third gate electrode 154A. For example, the first gate electrode 152A may include a first conductive material including a first impurity. The first impurity may include a component element included in the first gate insulating layer 132A, may be diffused from the first gate insulating layer 132A to the first gate electrode 152A, and may be included at a predetermined concentration in the first gate electrode 152A. The third gate electrode 154A may include a second conductive material including a second impurity. The second impurity may include a component element included in the third gate insulating layer 144A, may be diffused from the third gate insulating layer 144A to the third gate electrode 154A, and may be included at a predetermined concentration in the third gate electrode 154A.

While the first and second impurities are diffused to the first and third gate electrodes 152A and 154A, component elements included in the first and third gate electrodes 152A and 154A may also be diffused to the first and third gate insulating layers 132A and 144A. Therefore, the first gate insulating layer 132A may be a high-k layer including a metal element of the first gate electrode 152A in small quantities, and the third gate insulating layer 144A may be a high-k layer including a metal element of the third gate electrode 154A in small quantities.

In some example embodiments, an etch rate of the first gate electrode 152A may be different from an etch rate of the third gate electrode 154A. For example, at the time of using an etchant having a high etch rate of the third gate insulating layer 144A, the first gate electrode 152A may have a first etch rate, and the third gate electrode 154A may have a second etch rate greater than the first etch rate.

The integrated circuit device 100A described with reference to FIG. 2 may include the first and third gate electrodes 152A and 154A, which have different thicknesses. In the process of forming the first and third gate electrodes 152A and 154A, the first and second impurities of the first and third gate insulating layers 132A and 144A may be diffused to the first and third gate electrodes 152A and 154A through an additional annealing process, respectively. Therefore, the growth rate of the first gate electrode 152A may be different from the growth rate of the third gate electrode 154A, and the etch rate of the first gate electrode 152A may be different from the etch rate of the third gate electrode 154A. The first and third gate electrodes 152A and 154A may have a thickness difference of about 1 nm or less through the selective etching process at the time of forming the first and third gate electrodes 152A and 154A. The thickness difference between the first and third gate electrodes 152A and 154A may be smaller compared with the thickness difference between the first and third gate electrodes 152A and 154A in the case that the first and third gate electrodes 152A and 154A are formed through respective forming processes and/or respective etching processes using respective etching masks. Therefore, the first and second gate structures GL1A and GL2A may constitute fin field-effect transistors having different threshold voltages.

Figure 3:
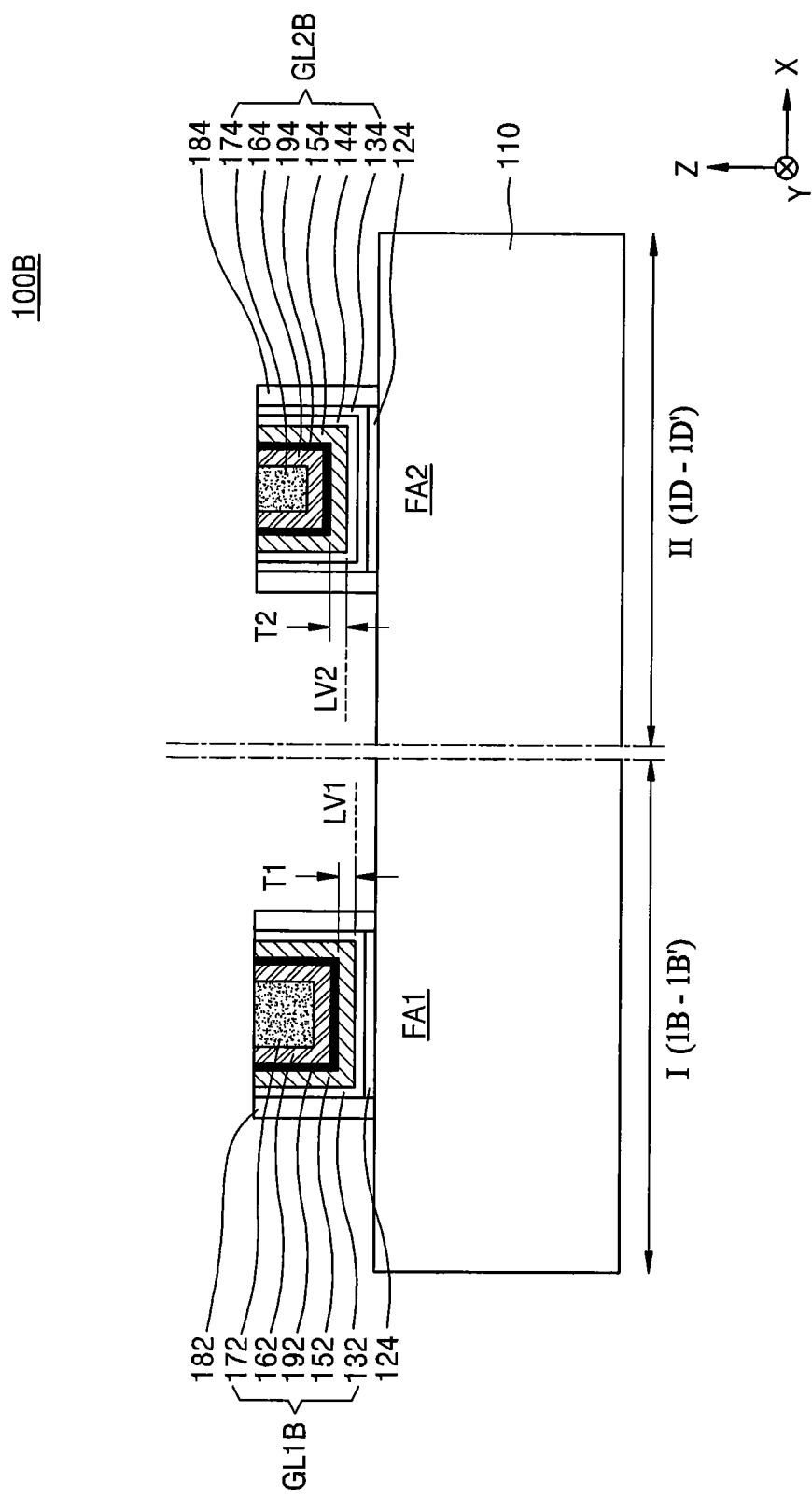
FIG. 3 is a cross-sectional view of an integrated circuit device according to some embodiments of the present inventive concept.

FIG. 3 is a cross-sectional view of an integrated circuit device 100B according to exemplary embodiments. FIG. 3 is a cross-sectional view taken along line 1B-1B' and line 1D-1D' of FIG. 1A. In FIG. 3, like reference numerals as used in FIGS. 1A to 1C refer to like elements, and detailed descriptions thereof will be omitted.

Referring to FIG. 3, a first gate structure GU B may further include a first barrier layer 192 disposed between a first gate electrode 152 and a second gate electrode 162, and a second gate structure GL2B may further include a second barrier layer 194 disposed between a third gate electrode 154 and a fourth gate electrode 164.

The first and second barrier layers 192 and 194 may include at least one selected from the group consisting of metal nitride, metal carbide, metal silicide, metal silicon nitride, and metal silicon carbide, each of which includes Ti and Ta solely or in combination. The first and second barrier layers 192 and 194 may be formed through an ALD process, an MOALD process, or an MOCVD process. The first barrier layer 192 may include substantially the same material as the second barrier layer 194, but the inventive concept is not limited thereto.

Figure 4:
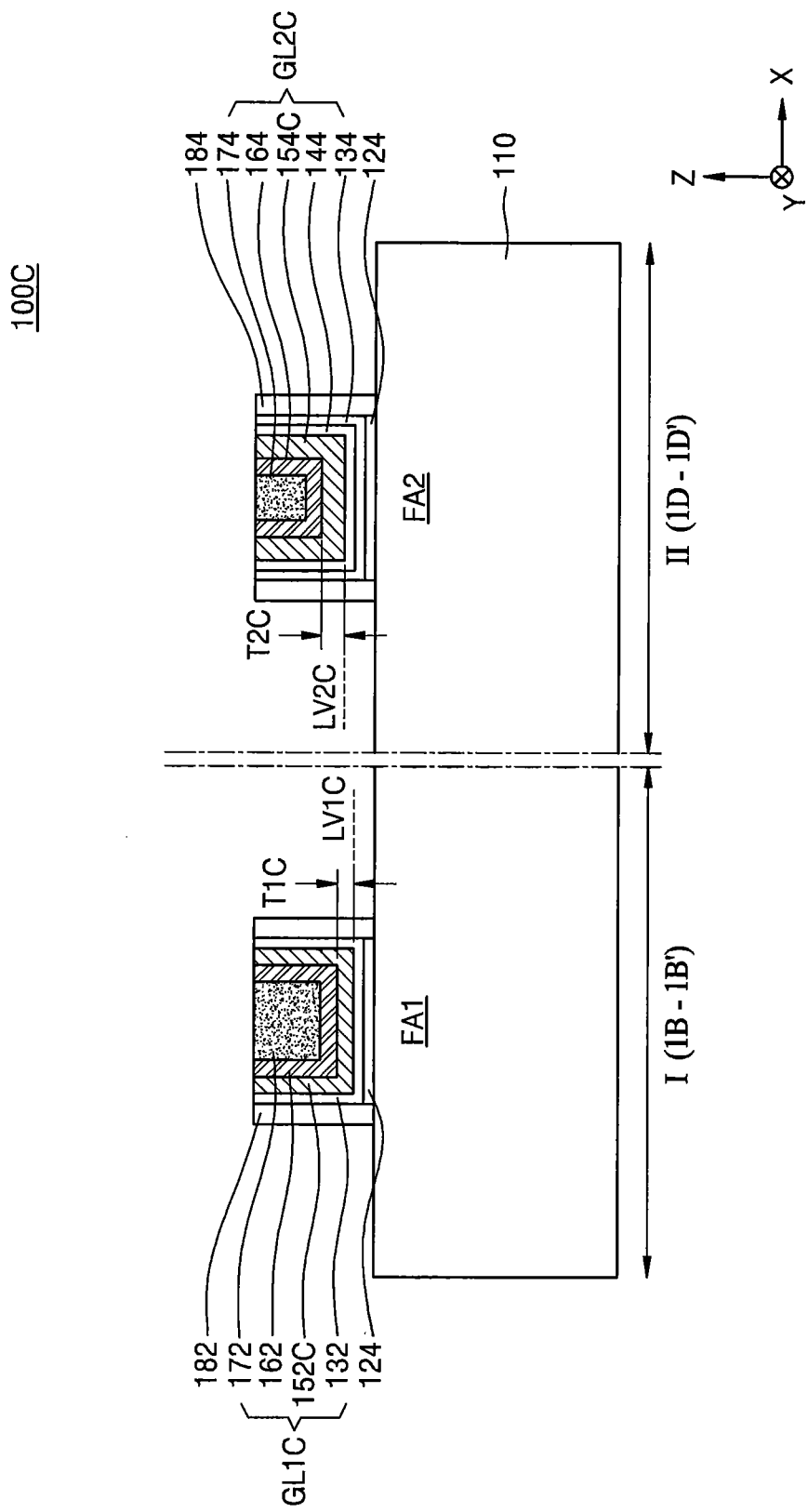
FIG. 4 is a cross-sectional view of an integrated circuit device according to some embodiments of the present inventive concept.

FIG. 4 is a cross-sectional view of an integrated circuit device 100C according to exemplary embodiments. FIG. 4 is a cross-sectional view taken along line 1B-1B' and line 1D-1D' of FIG. 1A. In FIG. 4, like reference numerals as used in FIGS. 1A to 1C refer to like elements, and detailed descriptions thereof will be omitted.

Referring to FIG. 4, a first gate structure GL1C may include a first gate electrode 152C formed on a first gate insulating layer 132, and the first gate electrode 152C may have a first thickness T1C in a vertical direction (for example, a Z-direction). A second gate structure GL2C may include a third gate electrode 154C formed on a third gate insulating layer 144, and the third gate electrode 154C may have a second thickness T2C greater than the first thickness T1C in the vertical direction (for example, the Z-direction). For example, the first thickness T1C and the second thickness T2C may be in the range of about 2 nm to about 50 nm. In addition, the second thickness T2C may be greater than the first thickness T1C by about 0.1 nm to about 1 nm, but the inventive concept is not limited thereto.

In some example embodiments, a material of the first gate insulating layer 132 may be different from a material of the third gate insulating layer 144. In the process of forming the first and third gate electrodes 152C and 154C, a growth rate of the third gate electrode 154C on the third gate insulating layer 144 may be greater than a growth rate of the first gate electrode 152C on the first gate insulating layer 132. The first and third gate electrodes 152C and 154C may have a thickness difference of about 1 nm or less. Therefore, the first and second gate structures GL1C and GL2C may constitute fin field-effect transistors having different threshold voltages.

Figure 5:
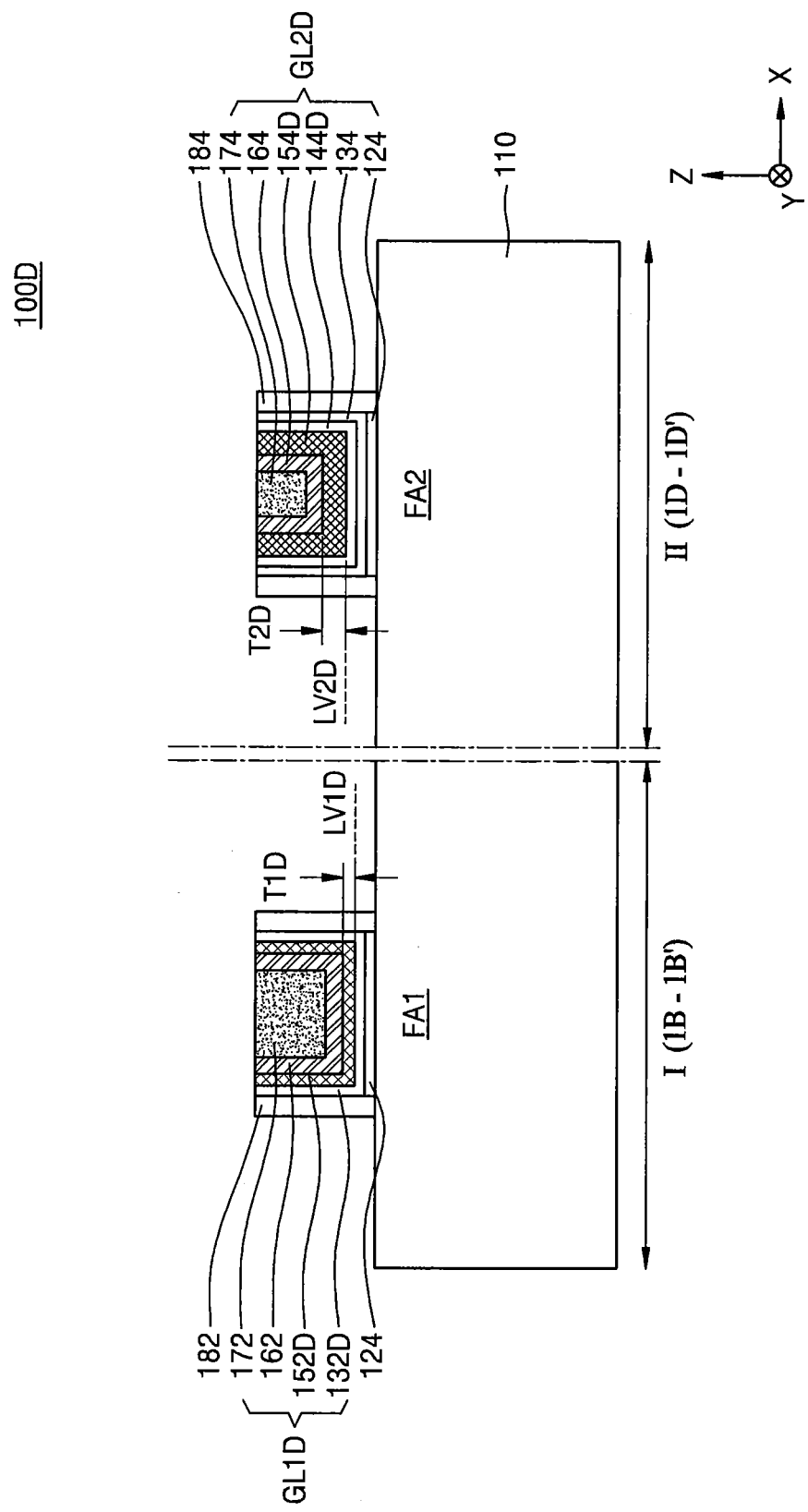
FIG. 5 is a cross-sectional view of an integrated circuit device according to some embodiments of the present inventive concept.

FIG. 5 is a cross-sectional view of an integrated circuit device 100D according to exemplary embodiments. FIG. 5 is a cross-sectional view taken along line 1B-1B' and line 1D-1D' of FIG. 1A. In FIG. 5, like reference numerals as used in FIGS. 1A to 1C refer to like elements, and detailed descriptions thereof will be omitted.

Referring to FIG. 5, a first gate structure GL1D may include a first gate electrode 152D formed on a first gate insulating layer 132D, and the first gate electrode 152D may have a first thickness T1D in a vertical direction (for example, a Z-direction). A second gate structure GL2D may include a third gate electrode 154D formed on a third gate insulating layer 144D, and the third gate electrode 154D may have a second thickness T2D greater than the first thickness T1D in the vertical direction (for example, the Z-direction).

A material of the first gate electrode 152D may be different from a material of the third gate electrode 154D. For example, the first gate electrode 152D may include a first conductive material including a first impurity. The first impurity may include a component element included in the first gate insulating layer 132D, may be diffused from the first gate insulating layer 132D to the first gate electrode 152D, and may be included at a predetermined concentration in the first gate electrode 152D. The third gate electrode 154D may include a second conductive material including a second impurity. The second impurity may include a component element included in the third gate insulating layer 144D, may be diffused from the third gate insulating layer 144D to the third gate electrode 154D, and may be included at a predetermined concentration in the third gate electrode 154D.

While the first and second impurities are diffused to the first and third gate electrodes 152D and 154D, component elements included in the first and second gate electrodes 152D and 154D may also be diffused to the first and third gate insulating layers 132D and 144D. Therefore, the first gate insulating layer 132D may be a high-k layer including a metal element of the first gate electrode 152D in small quantities, and the third gate insulating layer 144D may be a high-k layer including a metal element of the third gate electrode 154D in small quantities.

In some example embodiments, an etch rate of the first gate electrode 152D may be different from an etch rate of the third gate electrode 154D. For example, at the time of using an etchant having a high etch rate of the first gate insulating layer 132D, the first gate electrode 152D may have a first etch rate, and the third gate electrode 154D may have a second etch rate lower than the first etch rate.

The integrated circuit device 100D described with reference to FIG. 5 may include the first and third gate electrodes 152D and 154D, which have different thicknesses. In the process of forming the first and third gate electrodes 152D and 154D, the first and third gate electrodes 152D and 154D may have a thickness difference of about 1 nm or less, which is relatively small, through an additional annealing process and an additional etching process. Therefore, the first and second gate structures GL1D and GL2D may constitute fin field-effect transistors having different threshold voltages.

Figure 6:
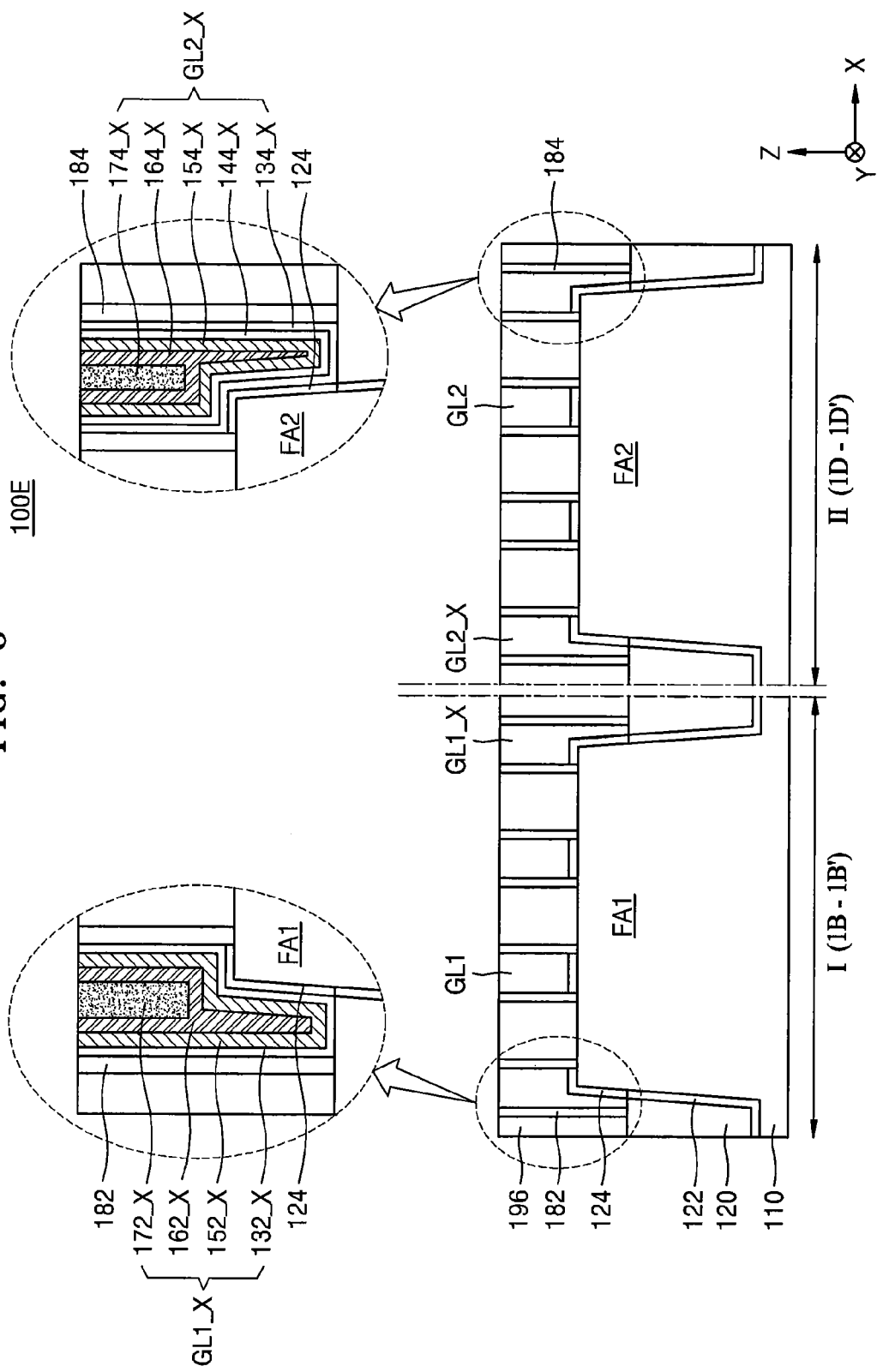
FIG. 6 is a cross-sectional view of an integrated circuit device according to some embodiments of the present inventive concept.

FIG. 6 is a cross-sectional view of an integrated circuit device 100E according to exemplary embodiments. In FIG. 6, like reference numerals as used in FIGS. 1A to 1C refer to like elements, and detailed descriptions thereof will be omitted.

Referring to FIG. 6, a first gate structure GL1 and a first dummy gate structure GL1_X may be spaced apart from each other on first fin-type active regions FA1 and isolation layers 120 and may extend in a direction (for example, a Y-direction) intersecting with an extension direction of the first fin-type active directions FA1. The first fin-type active regions FA1 may have long sides extending in an X-direction and short sides extending in the Y-direction. Upper portions of the first fin-type active regions FA1 may not be partially covered by the isolation layers 120. The first dummy gate structure GL1_X may be disposed to cover sidewalls of the long sides and sidewalls of the short sides in the first fin-type active regions FA1, which are not covered by the isolation layers 120.

The first dummy gate structure GL1_X may include a first gate insulating layer 132_X, a first gate electrode 152_X, a second gate electrode 162_X, and a first gap-filling metal layer 172_X, which are sequentially stacked on the first fin-type active regions FA1 and the isolation layers 120.

A second gate structure GL2 and a second dummy gate structure GL2_X may be spaced apart from each other on second fin-type active regions FA2 and isolation layers 120 and may extend in a direction (for example, the Y-direction) intersecting with an extension direction of the second fin-type active directions FA2. The second fin-type active regions FA2 may have long sides extending in the X-direction and short sides extending in the Y-direction. Upper portions of the second fin-type active regions FA2 may not be partially covered by the isolation layers 120. The second dummy gate structure GL2_X may be disposed to cover sidewalls of the long sides and sidewalls of the short sides in the second fin-type active regions FA2, which are not covered by the isolation layers 120.

The second dummy gate structure GL2_X may include a second gate insulating layer 134_X, a third gate insulating layer 144_X, a third gate electrode 154_X, and a fourth gate electrode 164_X, and a second gap-filling metal layer 174_X, which are sequentially stacked on the second fin-type active regions FA2 and the isolation layers 120.

Figure 7B:
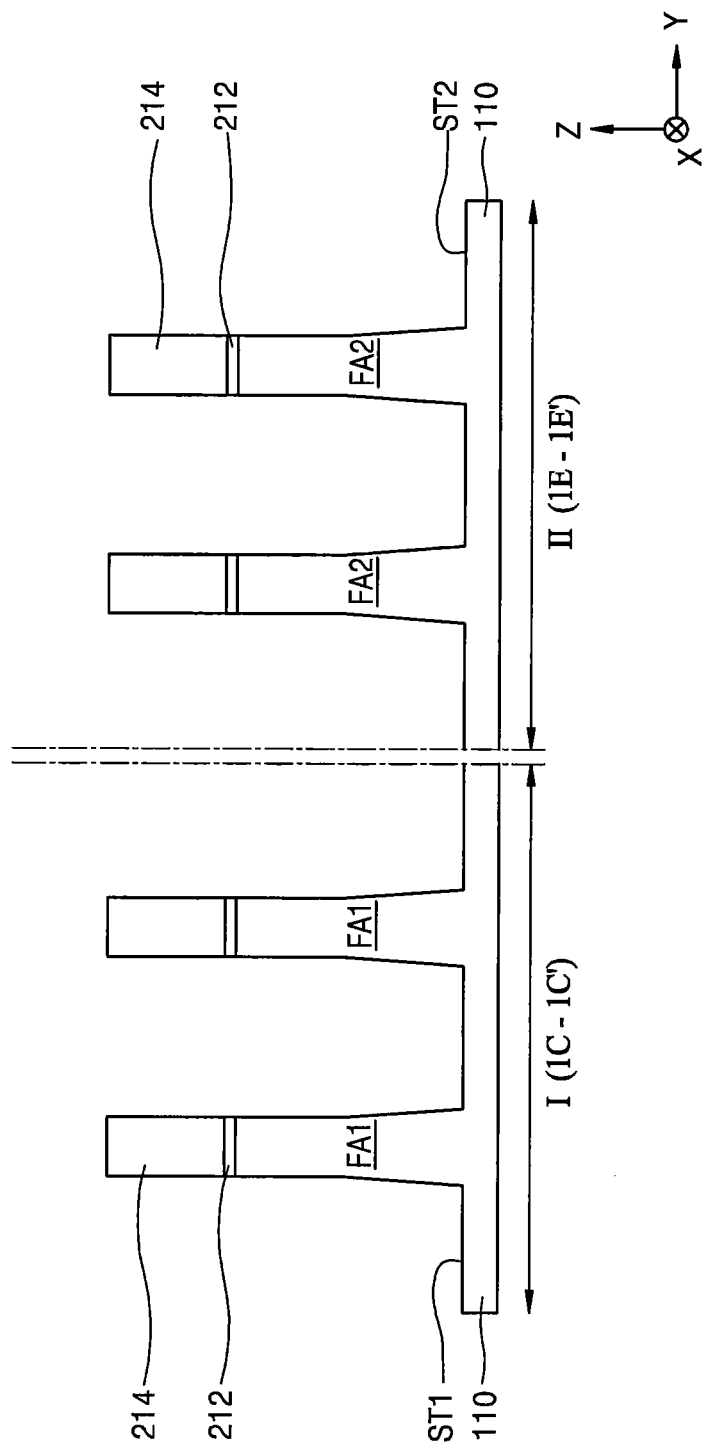
FIGS. 7A to 7O are cross-sectional views illustrating processing steps in the fabrication of an integrated circuit device according to some embodiments of the present inventive concept.

FIGS. 7A to 7O are cross-sectional views for describing a method of manufacturing an integrated circuit device, according to exemplary embodiments. The method of manufacturing the integrated circuit 100 of FIGS. 1A to 1C will be described with reference to FIGS. 7A to 7O. FIGS. 7A to 7F are cross-sectional views taken along line 1C-1C' and line 1E-1E' of FIG. 1A, and FIGS. 7G and 7O are cross-sectional views taken along lines 1B-1B' and 1D-1D' of FIG. 1A. In FIGS. 7A to 7O, like reference numerals as used in FIGS. 1A to 1C refer to like elements, and detailed descriptions thereof will be omitted herein.

Referring 7A, pad oxide layer patterns 212 and mask patterns 214 may be formed on a substrate 110 defining a first region I and a second region II. The pad oxide layer patterns 212 and the mask patterns 214 may extend in parallel to each other in one direction (for example, an X-direction) on the substrate 110.

In some example embodiments, the pad oxide layer patterns 212 may include oxide layers formed by thermally oxidizing a surface of the substrate 110. The mask patterns 214 may include one selected from the group consisting of a silicon nitride layer, a silicon oxynitride layer, a spin on glass (SOG) layer, a spin on hardmask (SOH) layer, a photoresist layer, and any combinations thereof, but are not limited thereto.

Referring to FIG. 7B, some regions of the substrate 110 may be etched by using the mask patterns 214 as etching masks to form first trenches ST1 in the first region I of the substrate 110 and to form second trenches ST2 in the second region II of the substrate 110. As the first and second trenches ST1 and ST2 are formed, the first fin-type active regions FA1 and the second fin-type active regions FA2 may be obtained. The first fin-type active regions FA1 and the second fin-type active regions FA2 protrude upward from the substrate 110 in a vertical direction (for example, a Z-direction) and extend in one direction (for example, the X-direction).

Referring to FIG. 7C, insulating liners 122 may be formed through a process of oxidizing exposed surfaces of the first and second fin-type active regions FA1 and FA2 to cover the exposed surfaces of the first and second fin-type active regions FA1 and FA2. For example, the insulating liners 122 may be formed through an ISSG process, a thermal oxidation process, or an $O_2$ plasma oxidation process.

Figure 7D:
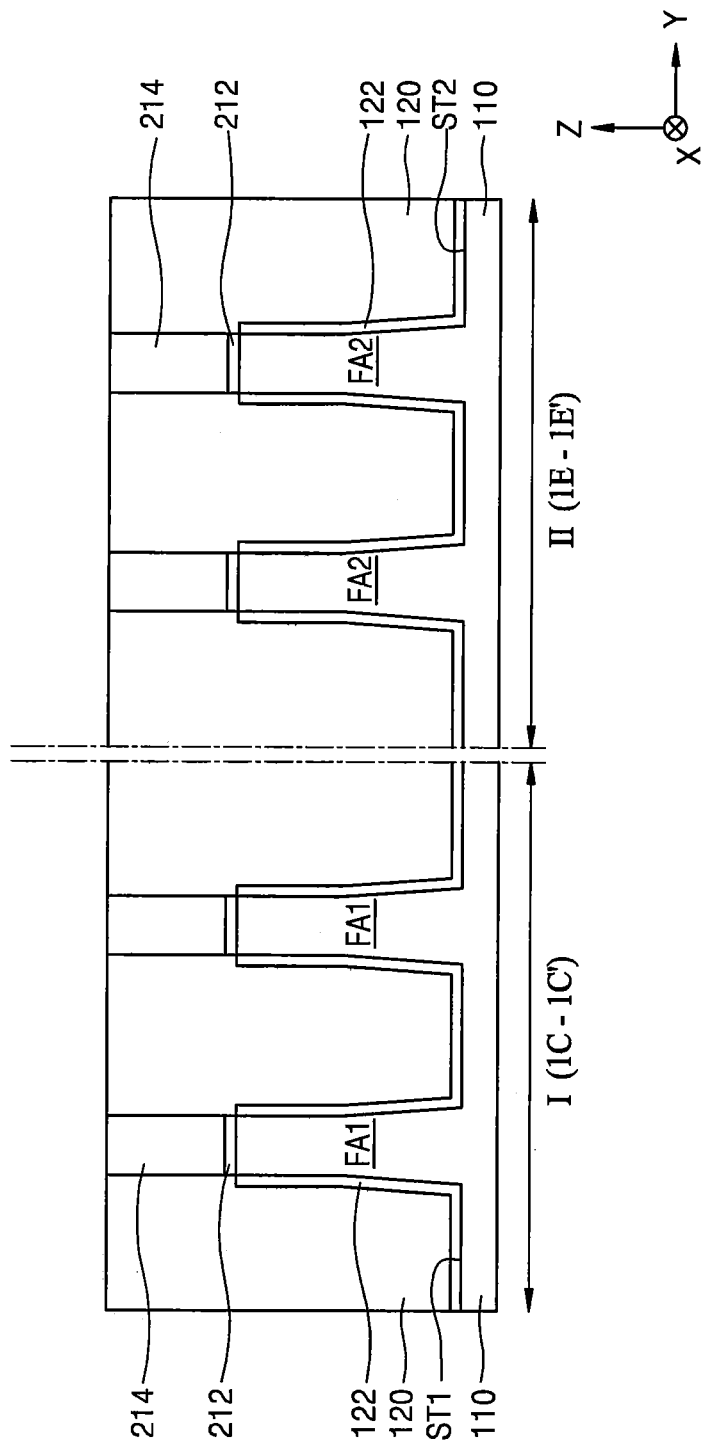

Referring to FIG. 7D, isolation layers 120 may be formed to fill the first and second trenches ST1 and ST2. In some example embodiments, the isolation layers 120 may be formed through an FCVD process or a spin coating process by using FSG, USG, BPSG, PSG, FOX, PE-TEOS, or TOSZ.

Optionally, an annealing process may be performed with respect to the substrate 110, on which the isolation layers 120 are formed.

Although not illustrated, deep trenches (not illustrated) may be formed by removing portions of the isolation layers 120, which surround portions of the first and second fin-type active regions FA1 and FA2 and perimeters of the first and second regions I and II, then, insulating layers (not illustrated) may be formed through a coating process or a deposition process to fill the deep trenches, and field insulating layers (not illustrated) may be formed by planarizing upper surfaces of the insulating layers until the mask patterns 214 are exposed. The field insulating layers may be formed deeper than the isolation layers 120 from an upper surface of the substrate 110 and may be a connection region that surrounds the first and second regions I and II.

Figure 7E:
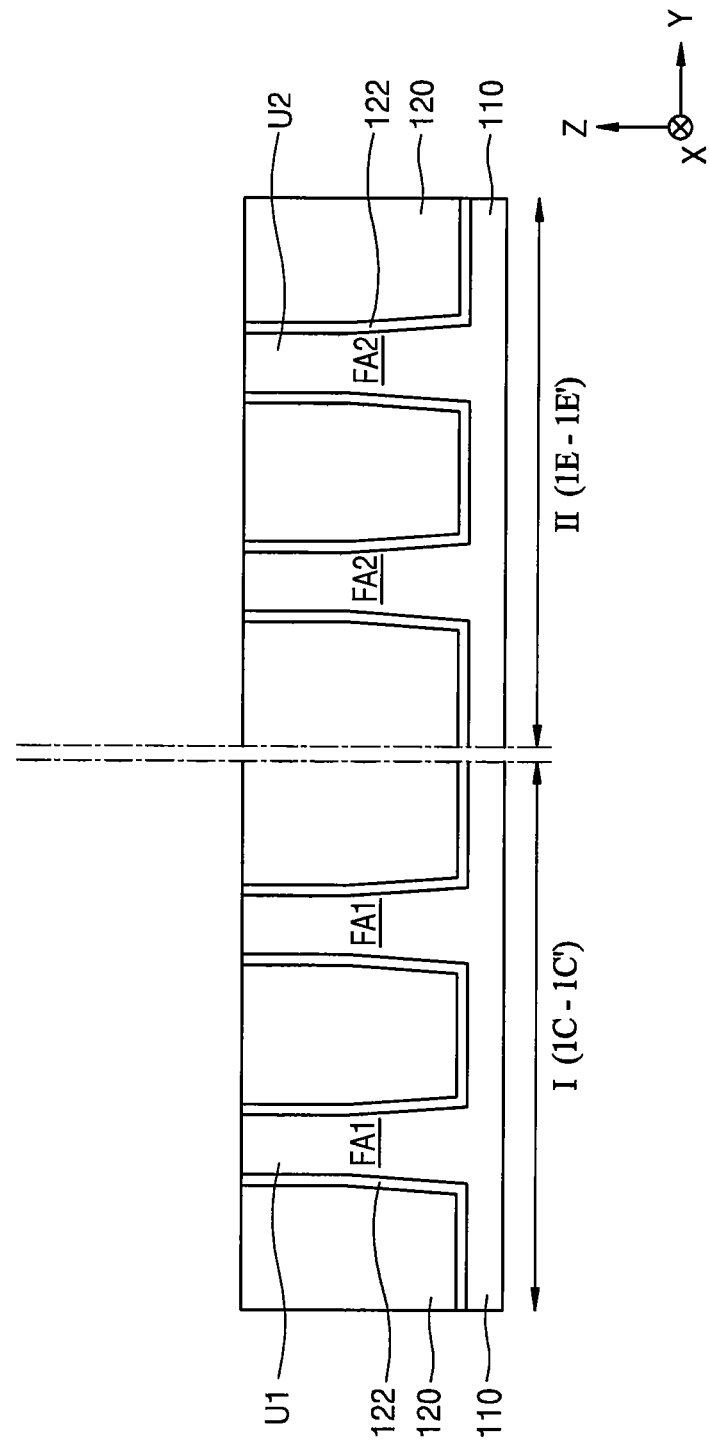

Referring to FIG. 7E, the mask patterns (214 of FIG. 7D), the pad oxide layer patterns (212 of FIG. 7D), and partial upper portions of the isolation layers 120 may be removed to expose upper portions U1 and U2 of the first and second fin-type active regions FA1 and FA2.

In some example embodiments, an impurity ion doping process for adjusting a threshold voltage may be performed with respect to the exposed upper portions U1 and U2 of the first and second fin-type active regions FA1 and FA2. For example, boron (B) ions may be implanted into the exposed upper portions U1 and U2 of the first and second fin-type active regions FA1 and FA2. However, the inventive concept is not limited thereto.

Figure 7F:
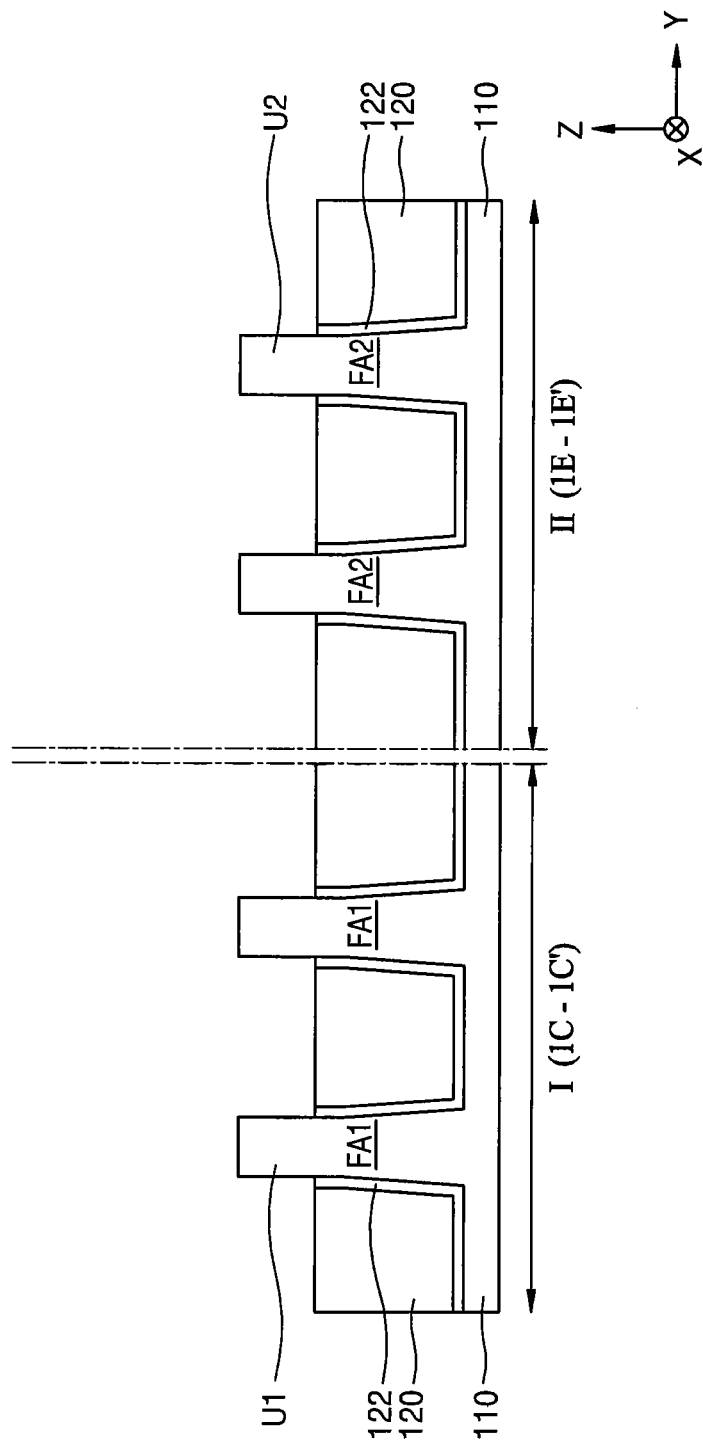
Figure 7G:
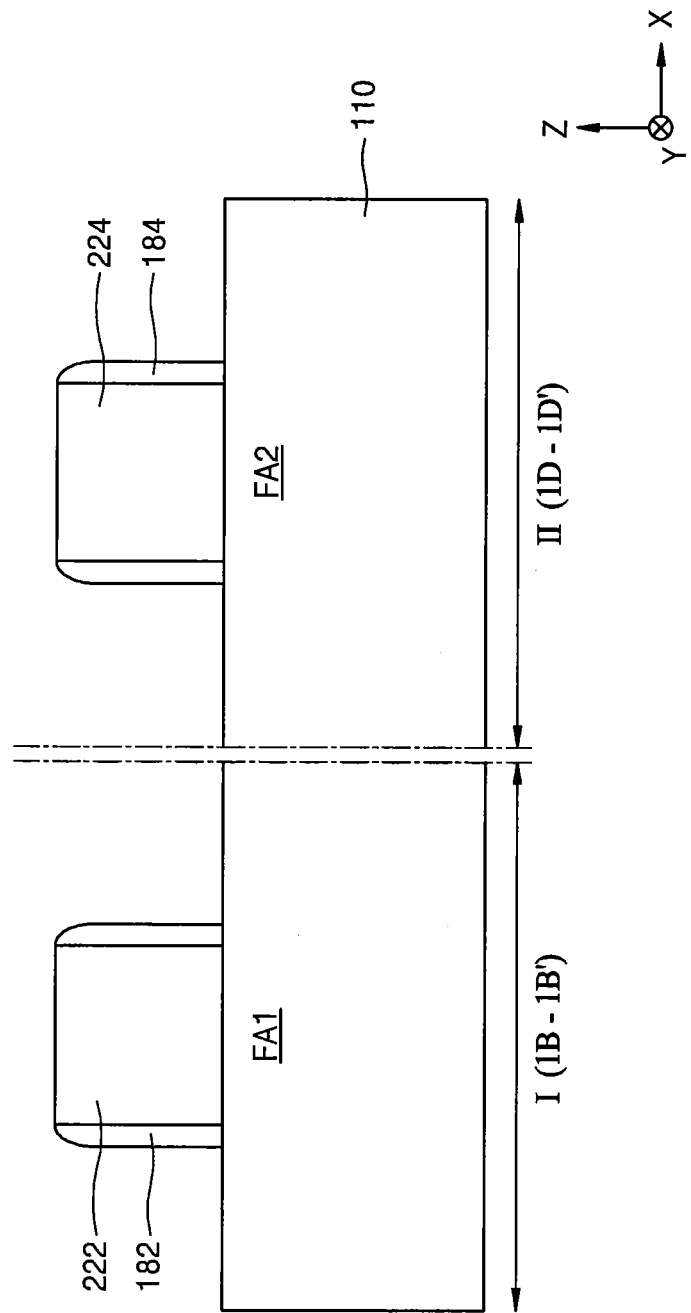

Referring to FIG. 7F, upper portions of the isolation layers 120 may be partially removed by performing an etch-back process on the isolation layers 120 such that upper surfaces and sidewalls of the first and second fin-type active regions FA1 and FA2 are exposed at the upper portions U1 and U2 of the first and second fin-type active regions FA1 and FA2.

Referring to FIG. 7G, first and second sacrifice gates 222 and 224 may be formed on the first and second fin-type active regions FA1 and FA2 and the isolation layers 120 so as to extend in a direction intersecting with the extension direction (for example, the X-direction) of the first and second fin-type active regions FA1 and FA2.

In the exemplary process of forming the first and second sacrifice gates 222 and 224, after conductive layers (not illustrated) are formed on the substrate 110 on which the first and second fin-type active regions FA1 and FA2 and the isolation layers 120 are formed, the first and second sacrifice gates 222 and 224 may be formed by patterning the conductive layers. A micropattern forming process such as a double patterning technology (DPT) or a quadruple patterning technology (QPT) may be performed in the patterning process. In some example embodiments, the first and second sacrifice gates 222 and 224 may be formed by using polysilicon but are not limited thereto.

After insulating layers (not illustrated) are formed at a uniform thickness on the substrate 110, the first and second sacrifice gates 222 and 224, first and second spacers 182 and 184 may be formed by performing an etch-back process with respect to the insulating layers until upper surfaces of the first and second fin-type active regions FA1 and FA2 are exposed. The first and second spacers 182 and 184 may cover both side surfaces of the first sacrifice gate 222 and both side surfaces of the second sacrifice gate 224, respectively. In some example embodiments, the first and second spacers 182 and 184 may be formed by using silicon nitride but are not limited thereto.

Figure 7H:
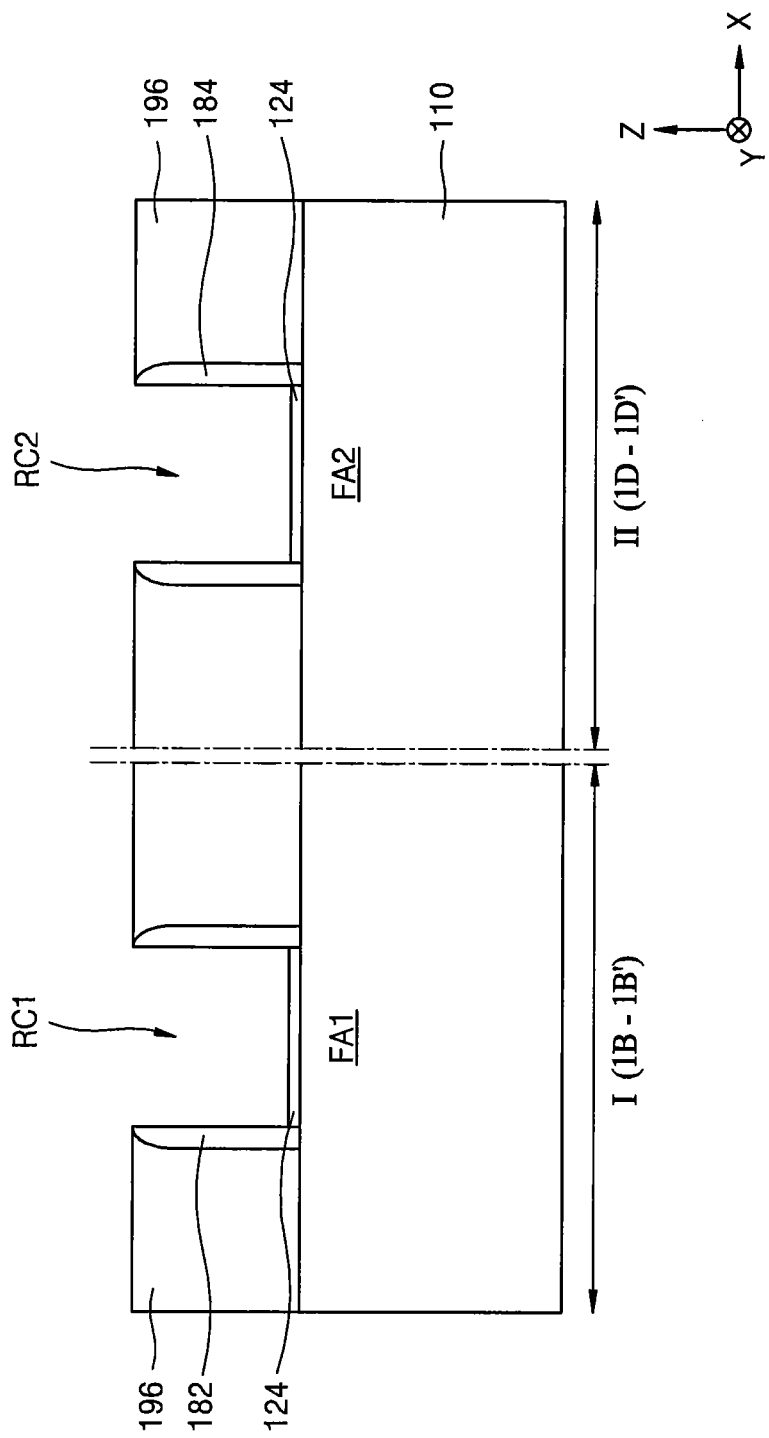

Referring to FIG. 7H, after insulating layers (not illustrated) are formed on the substrate 110 on which the first and second spacers 182 and 184 are formed, so as to fill a space between the adjacent first and second sacrifice gates 222 and 224, and insulating interlayers 196 may be formed by performing a planarizing process on the insulating layers, such as a chemical mechanical (CMP) process until upper surfaces of the first and second sacrifice gates 222 and 224 are exposed.

First and second recess spaces RC1 and RC2 may be defined by removing the first and second sacrifice gates 222 and 224 so as to partially expose surfaces of the first and second fin-type active regions FA1 and FA2 and the isolation layers 120 between a pair of first spacers 182 and between a pair of second spacers 184.

Interface layers 124 may be formed by performing a process of oxidizing the exposed surfaces of the first and second fin-type active regions FA1 and FA2 to cover the exposed surfaces of the first and second fin-type active regions FA1 and FA2. For example, the interface layers 124 may be formed through an ISSG process, a thermal oxidation process, a UV oxidation process, or an $O_2$ plasma oxidation process.

Referring to FIG. 7I, first and second preliminary gate insulating layers 130 and 140 may be sequentially formed on the substrate 110, on which the first and second spacers 182 and 184 and the interface layers 124 are formed.

In some example embodiments, the first preliminary gate insulating layers 130 may be formed at a uniform thickness on the upper surfaces and the side surfaces of the first and second fin-type active regions FA1 and FA2 in the first and second recess spaces RC1 and RC2. In addition, the first preliminary gate insulating layers 130 may be formed at a uniform thickness on opposite side surfaces of the pair of first spacers 182 and opposite side surfaces of the pair of second spacers 184 inside the first and second recess spaces RC1 and RC2. The second preliminary gate insulating layers 140 may be formed at a uniform thickness on the first preliminary gate insulating layer 130 in the first and second recess spaces RC1 and RC2.

The first and second preliminary gate insulating layers 130 and 140 may include one selected from the group consisting of a silicon oxide layer, a high-k layer, and a combination thereof. For example, the first and second preliminary gate insulating layers 130 and 140 may have a dielectric constant of about 7 to about 25. In some example embodiments, the high-k layer may include silicon oxynitride or at least one selected from the group consisting of oxide, oxynitride, silicate, and silicon oxides of Hf, Zr, Ti, Ta, Nb, Al, Mg, Ca, St, Sc, Y, La, and a lanthanoid element. In some example embodiments, a material of the first preliminary gate insulating layer 130 may be different from a material of the second preliminary gate insulating layer 140.

Figure 7J:
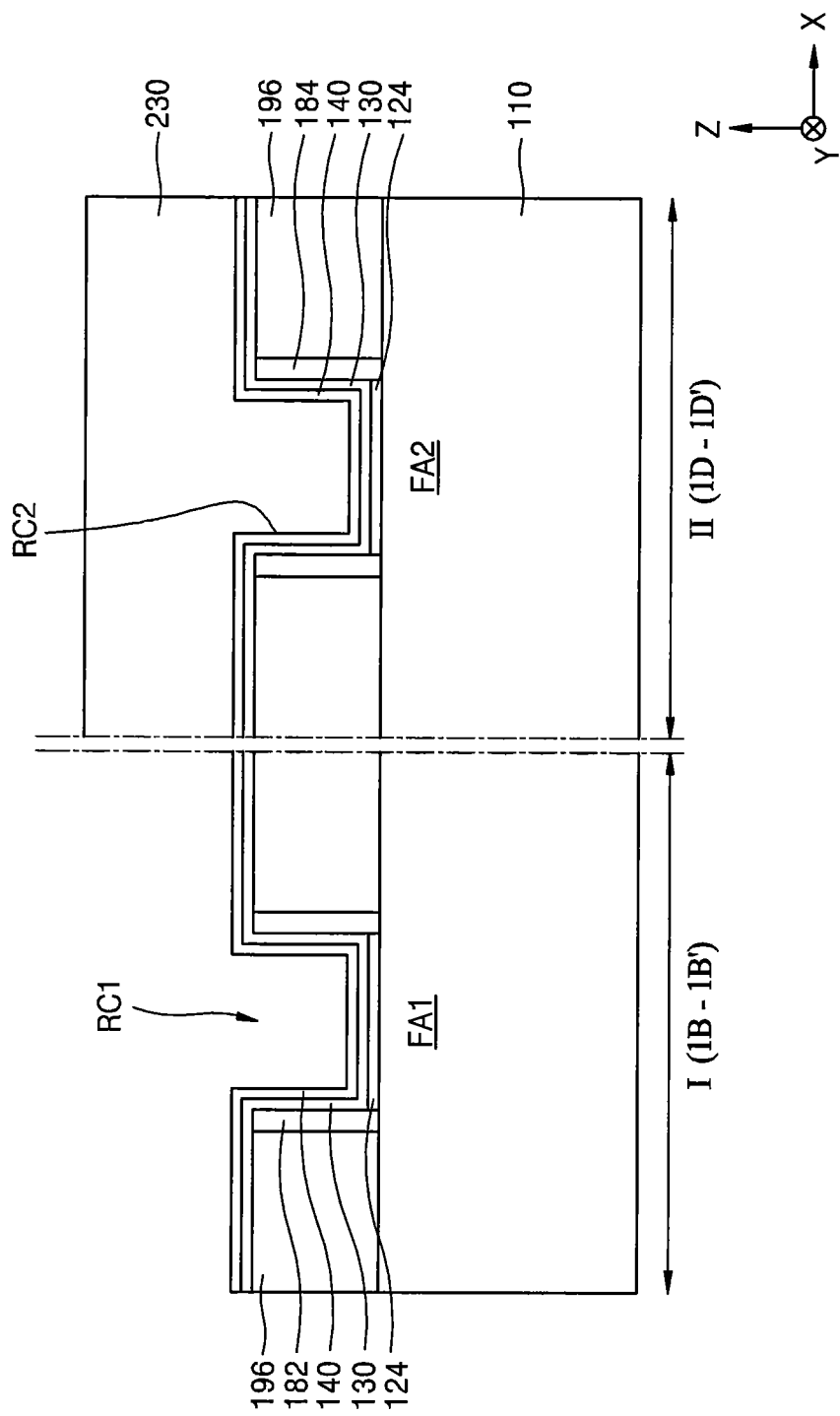

Referring to FIG. 7J, a mask layer 230 may be formed on the second region II of substrate 110, on which the second preliminary gate insulating layer 140 is formed.

Figure 7K:
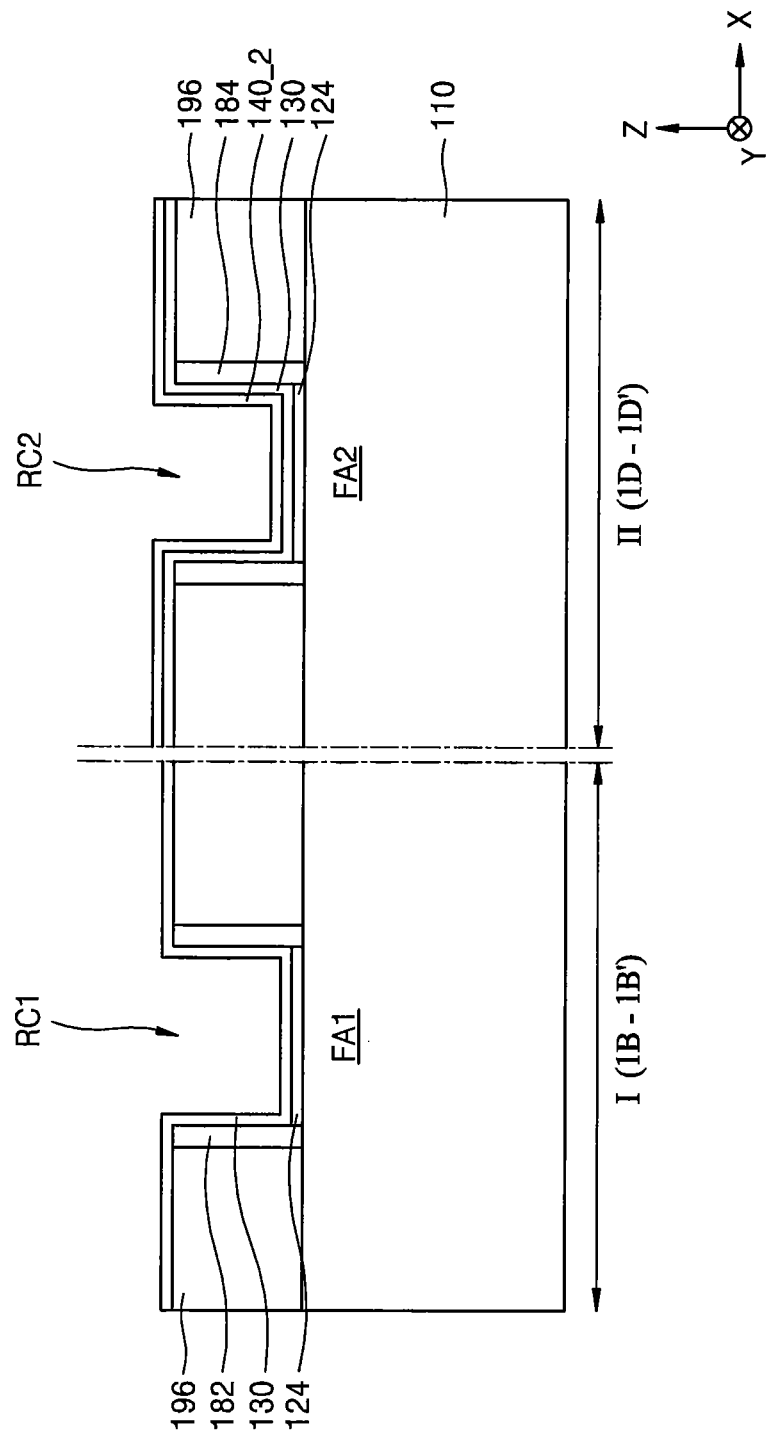

Referring to FIGS. 7J and 7K, the first preliminary gate insulating layer 130 on the first region I may be exposed by removing the second preliminary gate insulating layer 140 on the first region I by using the mask layer 230 as an etching mask.

In some example embodiments, the process of removing the second preliminary gate insulating layer 140 may be a wet etching process or a dry etching process but is not limited thereto. For example, the second preliminary gate insulating layer 140 on the first region I may be removed by performing the wet etching process or the dry etching process using en etchant that has a high etch selectivity with respect to the second preliminary gate insulating layer 140. Alternatively, the second preliminary gate insulating layer 140 on the first region I may be removed by performing a reactive ion etching process using an etchant that has a reaction selectivity with respect to the second preliminary gate insulating layer 140.

A second preliminary gate insulating layer 140_2 on the second region II may not be removed or damaged by the etching process due to the mask layer 230 thereon.

The mask layer 230 may be removed later.

Figure 7L:
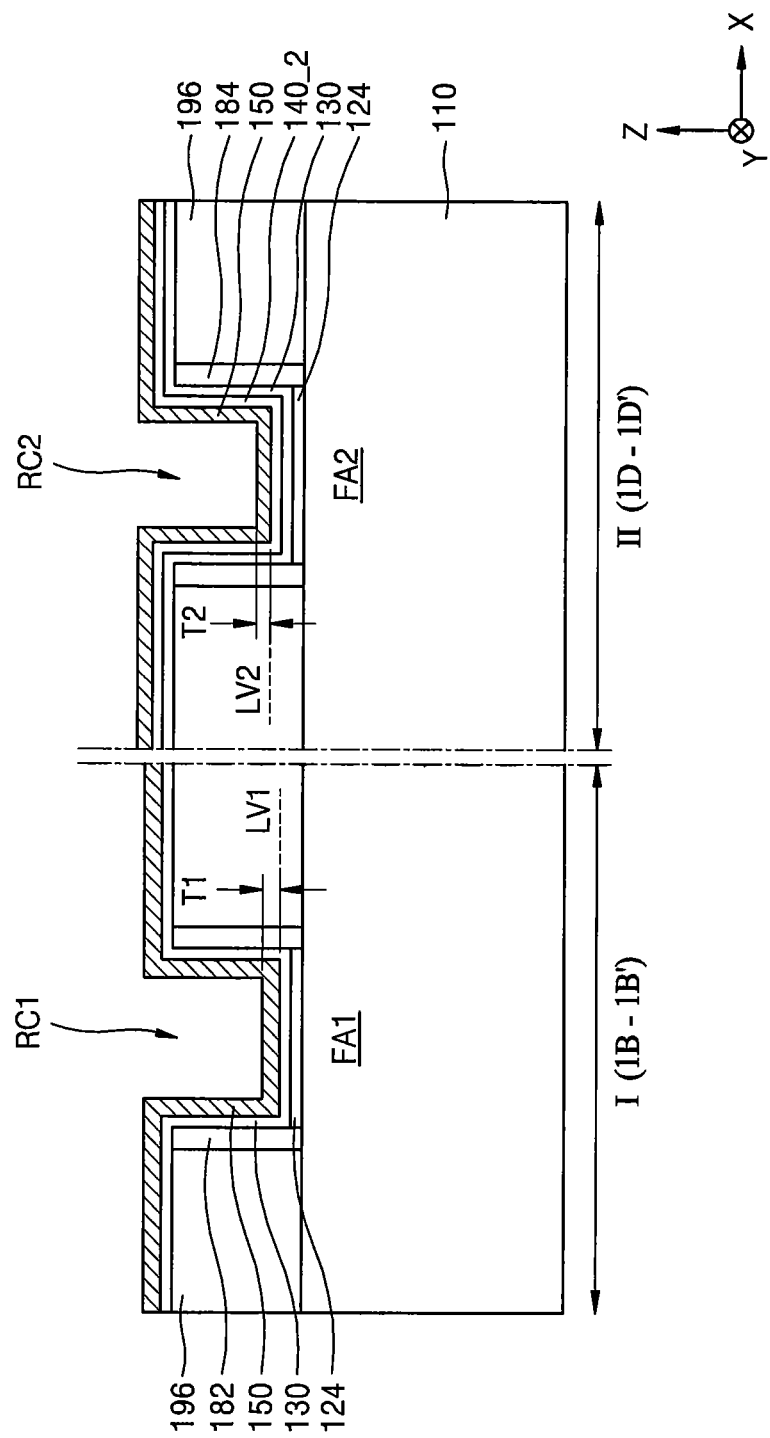

Referring to FIG. 7L, first preliminary gate electrode layers 150 may be formed in the first region I and the second region II of the substrate 110, in which the first preliminary gate insulating layer 130 and the second preliminary gate insulating layer 140_2 are exposed.

The first preliminary gate electrode layer 150 may be formed through an ALD process, an MOALD process, or an MOCVD process by using at least one selected from the group consisting of metal nitride, metal carbide, metal silicide, metal silicon nitride, and metal silicon carbide, each of which includes Ti and Ta solely or in combination.

The MOALD process including a sequence to be repeated twice or more may be performed in the exemplary process of forming the first preliminary gate electrode layers 150. For example, the sequence may be repeated twice or more in the MOALD process. The sequence may include: a first supplying process of supplying a first precursor including a first component element of the first preliminary gate electrode layers 150 on the substrate 110, in which the first and second preliminary gate insulating layers 130 and 140_2 are exposed, so as to be chemisorbed on the first and second preliminary gate insulating layers 130 and 140_2; a first purging process of purging the unreacted first precursor; a second supplying process of supplying a second precursor including a second component element of the first preliminary gate electrode layers 150 on the substrate 110, in which the first and second preliminary gate insulating layers 130 and 140_2 are exposed, so as to be chemisorbed on the first and second preliminary gate insulating layers 130 and 140_2; and a second purging process of purging the unreacted second precursor. Alternatively, the sequence may further include an annealing process after the second supplying process or the second purging process. In the second supplying process and/or the annealing process, the first preliminary gate electrode layers 150 may be formed by combining the first and second precursors chemisorbed on the first and second preliminary gate insulating layers 130 and 140_2. For example, when the first preliminary gate electrode layers 150 include titanium nitride (TiN), the first precursor may be titanium tetrachloride (TiCl$_4$), and the second precursor may be ammonia (NH3). However, the inventive concept is not limited thereto.

In some example embodiments, a material of the first preliminary gate insulating layer 130 may be different from a material of the second preliminary gate insulating layer 140_2. Therefore, in the first supplying process, a first amount of the first precursor chemisorbed on the first preliminary gate insulating layer 130 of the first region I may be different from a second amount of the first precursor chemisorbed on the second preliminary gate insulating layer 140_2 of the second region II due to a difference between surfaces of the exposed first and second preliminary gate insulating layers 130 and 140_2. In addition, in the second supplying operation, a third amount of the second precursor chemisorbed on the first preliminary gate insulating layer 130 of the first region I may be different from a fourth amount of the second precursor chemisorbed on the second preliminary gate insulating layer 140_2 of the second region II due to the difference between surfaces of the first and second preliminary gate insulating layers 130 and 140_2 and/or an amount difference (for example, a difference between the first amount and the second amount) of the first precursor chemisorbed on the surfaces. Therefore, a first thickness T1 of the first preliminary gate electrode layer 150 on the first preliminary gate insulating layer 130 of the first region I may be different from a second thickness T2 of the first preliminary gate electrode layer 150 on the second preliminary gate insulating layer 140_2 of the second region II. For example, the first thickness T1 of the first preliminary gate electrode layer 150 in the first region I may be about 0.1 nm to about 1 nm greater than the second thickness T2 of the first preliminary gate electrode layer 150 in the second region II.

Referring to 7M, first preliminary gate electrode layers 160 may be formed on the substrate 110, on which the first preliminary gate electrode layers 150 are formed. For example, the second preliminary gate electrode layers 160 may be formed through an ALD process, an MOALD process, or an MOCVD process by using at least one selected from the group consisting of Ti, Ta, W, Ru, Nb, Mo, Al, Hf, Ni, Co, Pt, Yb, Tb, Dy, Er, and Pd.

Unlike in FIG. 7M, when barrier metal layers (see 192 and 194 of FIG. 3) are formed before the second preliminary gate electrode layers 160 are formed, the integrated circuit device 100B described with reference to FIG. 3 may be formed.

Figure 7N:
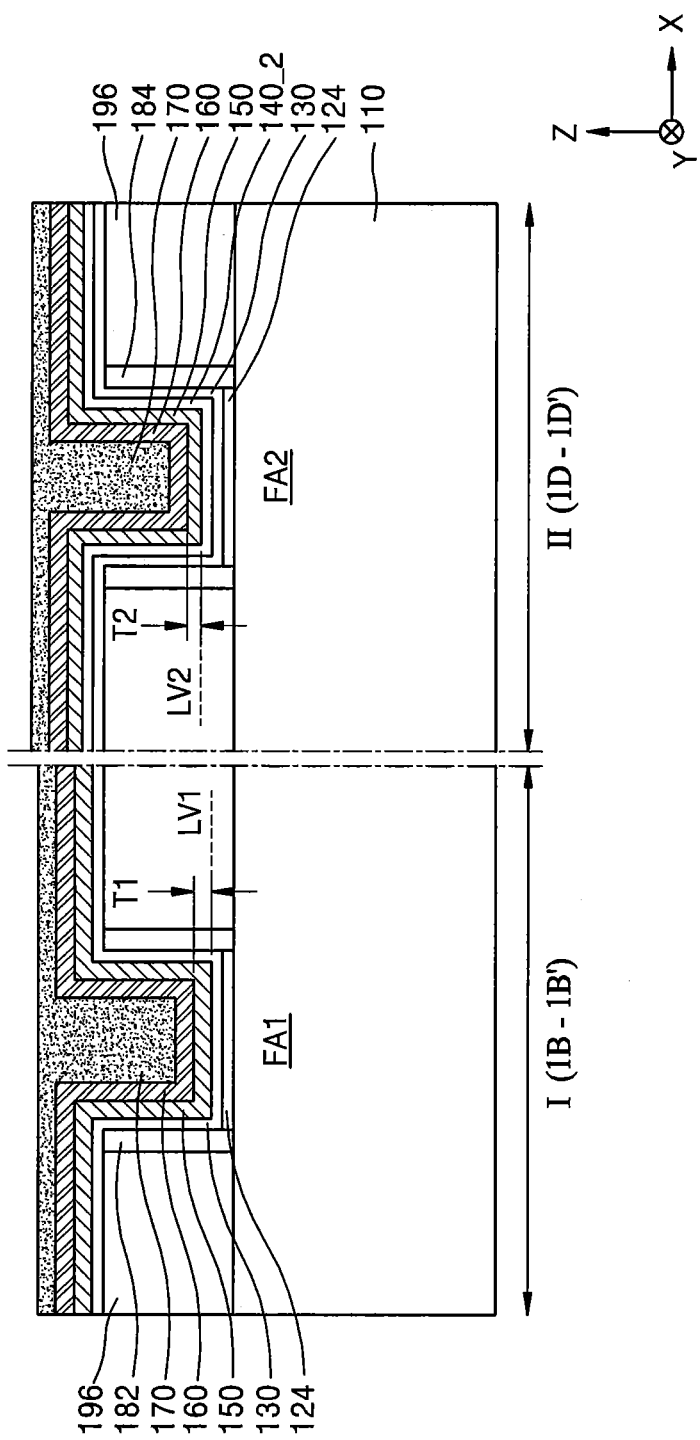
Figure 70:
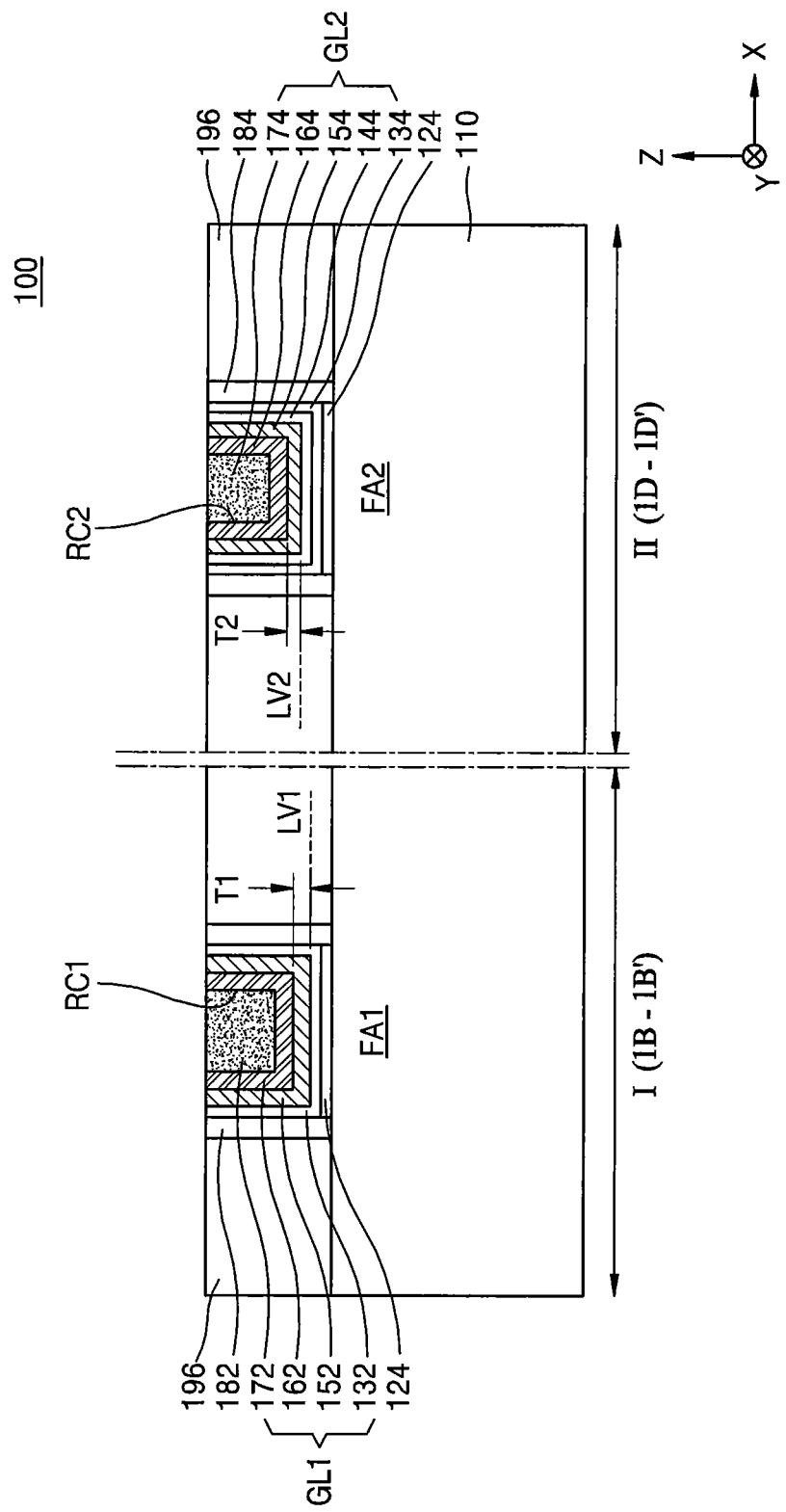

Referring to FIG. 7N, preliminary gap-filling metal layers 170 may be formed on the substrate 110 on which the second preliminary gate electrode layers 160 are formed. The preliminary gap-filling metal layers 170 may fill the first and second recess spaces RC1 and RC2 on the second preliminary gate electrode layers 160.

Referring to FIG. 7O, the insulating interlayers 196 may be exposed by performing a planarizing process on the substrate 110 on which the preliminary gap-filling metal layers 170 are formed. In the planarizing process, the first gate insulating layers (130 of FIG. 7N) on the insulating interlayers 196 may be removed, and a first gate insulating layer 132 and a second gate insulating layer 134 may be formed in the first and second recess spaces RC1 and RC2, respectively. In addition, in the planarizing process, the second gate insulating layer (140_2 of FIG. 7N) on the insulating interlayer 196 may be removed, and a third gate insulating layer 144 may be formed in the second recess space RC2. In the planarizing process, the first preliminary gate electrode layers (150 of FIG. 7N) on the insulating interlayers 196 may be removed, and a first gate electrode 152 and a third gate electrode 154 may be formed in the first and second recess spaces RC1 and RC2, respectively. In the planarizing process, the second preliminary gate electrode layers (160 of FIG. 7N) on the insulating interlayers 196 may be removed, and a second gate electrode 162 and a fourth gate electrode 164 may be formed in the first and second recess spaces RC1 and RC2, respectively. In the planarizing process, the preliminary gap-filling metal layers (170 of FIG. 7N) on the insulating interlayers 196 may be removed, and a first gap-filling metal layer 172 and a second gap-filling metal layer 174 may be formed in the first and second recess space RC1 and RC2. Therefore, the first and second gate structures GL1 and GL2 may be formed in the first and second recess spaces RC1 and RC2 of the first and second regions I and II, respectively.

The integrated circuit device 100 described with reference to FIGS. 1A to 1C may be manufactured by the processes described above.

In the method of manufacturing the integrated circuit device 100 described with reference to FIGS. 7A to 7O, the growth rate of the first preliminary gate electrode layer 150 on the first region I may be different from the growth rate of the first preliminary gate electrode layer 150 on the second region II due to a difference between materials of the first and second preliminary gate insulating layers 130 and 140_2. Therefore, the thickness of the first preliminary gate electrode layer 150 in the first region I may be slightly different from the thickness of the first preliminary gate electrode layer 150 in the second region II. When the thickness of the first preliminary gate electrode layer 150 in the first region I is different from the thickness of the first preliminary gate electrode layer 150 in the second region II, the first preliminary gate electrode layers 150 may be damaged in the patterning process, and the thickness difference of the first preliminary gate electrode layers 150 may be, for example, a relatively large value of several nanometers so as to secure a margin of the patterning process. Thus, it may be difficult to precisely control thicknesses of the first preliminary gate electrode layers 150 through the patterning process such that the portions of the first preliminary gate electrode layers 150 has a thickness difference of 1 nm or less. However, according to the method of manufacturing the integrated circuit device described with reference to FIGS. 7A to 7O, the portions of the first preliminary gate electrode layers 150 may have a thickness difference of about 1 nm or less, which is relatively small value, and thus, the first and second gate structures GL1 and GL2 may constitute fin field-effect transistors having different threshold voltages.

Figure 8A:
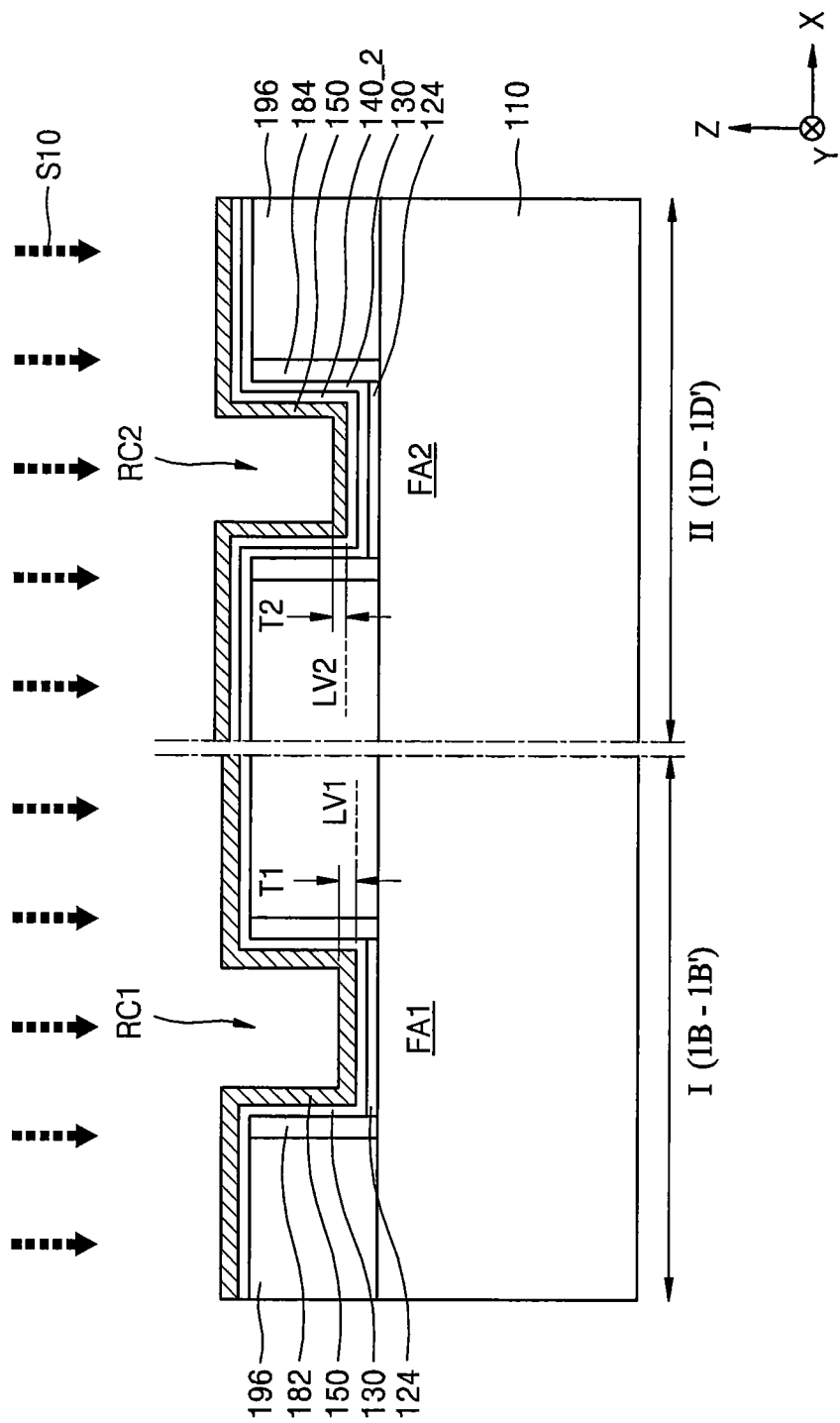
FIGS. 8A to 8C are cross-sectional views processing steps in the fabrication of an integrated circuit device according to some embodiments of the present inventive concept.
Figure 8B:
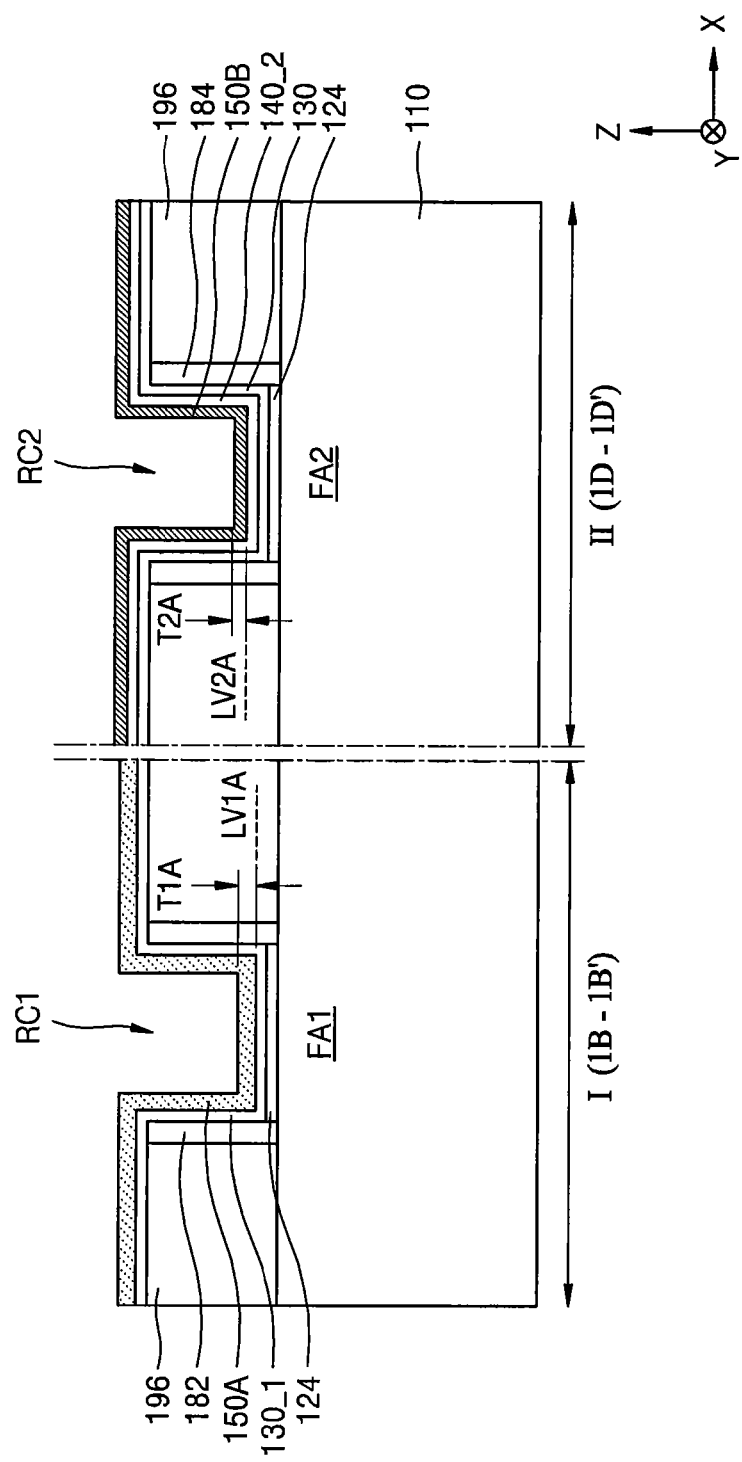
Figure 8C:
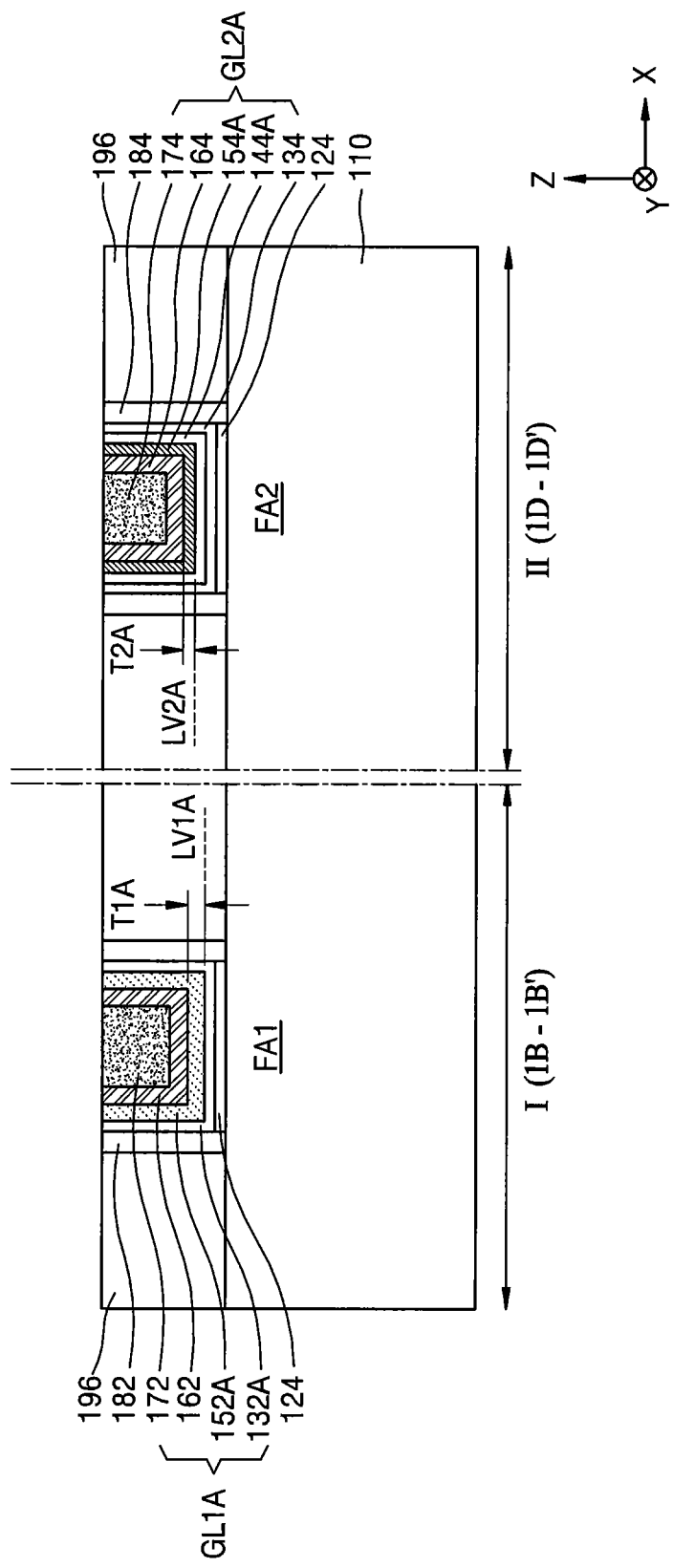

FIGS. 8A to 8C are cross-sectional views for describing a method of manufacturing an integrated circuit device, according to exemplary embodiments. An exemplary method of manufacturing the integrated circuit device 100A illustrated in FIG. 2 will be described with reference to FIGS. 8A to 8C. FIGS. 8A and 8C are cross-sectional views taken along line 1B-1B' and line 1D-1D' of FIG. 1A. In FIGS. 8A to 8C, like reference numerals as used in FIGS. 7A to 7O refer to like elements, and detailed descriptions thereof will be omitted.

The processes described with reference with FIG. 7A to 7O may be performed.

Referring to 8A, an annealing process S10 may be performed on the substrate 110 on which first preliminary gate electrode layers 150 are formed. The annealing process S10 may be a pre-treatment process of adjusting a thickness of the preliminary gate electrode layers 150. In some example embodiments, in the annealing process S10, a plasma treatment process or a heat treatment process may be performed on the substrate 110.

Referring to FIGS. 8A and 8B, in the annealing process S10, an inter-diffusion or mixing of component elements may occur between the first preliminary gate electrode layer 150 and first preliminary gate insulating layers 130 thereunder on a first region I. For example, a component element included in the first preliminary gate electrode layer 150 may be diffused to the first preliminary gate insulating layer 130, and a component element included in the first preliminary gate insulating layer 130 may be diffused to the first preliminary gate electrode layers 150. In addition, in the annealing process S10, an inter-diffusion or mixing of component elements may occur between the first preliminary gate electrode layer 150 and a second preliminary gate insulating layer 140_2 thereunder on a second region II. For example, a component element included in the first preliminary gate electrode layer 150 may be diffused to the second preliminary gate insulating layer 140_2, and a component element included in the second preliminary gate insulating layer 140_2 may be diffused to the first preliminary gate electrode layer 150.

As illustrated in FIG. 8B, a material component of a first preliminary gate insulating layer 130_1 on the first region I after the annealing process S10 may be different from a material component of the first preliminary gate insulating layer (130 of FIG. 8A) on the first region I before the annealing operation S10. In addition, after the annealing operation S10, a material component of the second preliminary gate insulating layer 140_2 on the second region II may be different from a material component of the first preliminary gate insulating layer 130_1. A material component of a first preliminary gate electrode layer 150A on the second region II after the annealing operation S10 may be different from a different material component of the first preliminary gate electrode layer (150 of FIG. 8A) on the second region II before the annealing operation S10. A material component of a first preliminary gate electrode layer 150B on the second region II after the annealing operation S10 may be different from a material component of the first preliminary gate electrode layer (150 of FIG. 8A) on the second region II before the annealing operation S10.

An etching process may be performed on the substrate 110 on which the first preliminary gate electrode layers 150A and 150B are formed. The etching process may be a wet etching process or a dry etching process. For example, the etching process may be a wet etching process using an etchant that has an etch selectivity with respect to the component element included in the second preliminary gate insulating layer 140_2. In addition, the etching process may be a reactive ion etching process using an etchant that has a reaction selectivity with respect to the component element included in the second preliminary gate insulating layer 140_2.

The first preliminary gate electrode layer 150B on the second region II may include the component element included in the second preliminary gate insulating layer 140_2 in a predetermined content. In the etching process, an etch rate of the first preliminary gate electrode layer 150B on the second region II may be relatively high. The first preliminary gate electrode layer 150A on the first region I may include the component element included in the first preliminary gate insulating layer 130_1 in a predetermined content. In the etching process, an etch rate of the first preliminary gate electrode layer 150A on the first region I may be relatively low. Therefore, after the etching process, the first preliminary gate electrode layer 150A on the first region I may have a first thickness T1A, and the first preliminary gate electrode layer 150B on the second region II may have a second thickness T2A that is less than the first thickness T1A.

The integrated circuit device 100A illustrated in FIG. 8C may be manufactured by performing the similar processes as the processes described with reference to FIGS. 7M to 7O.

In the method of manufacturing the integrated circuit 100A, described with reference to FIGS. 8A to 8C, as the additional annealing process S10 and the etching process are performed, the growth rate and the etch rate of the first preliminary gate electrode layer 150A on the first region I may be different from the growth rate and the etch rate of the first preliminary gate electrode layer 150B on the second region II. The first preliminary gate electrode layers 150A and 150B may have a thickness difference of about 1 nm or less. Therefore, the first and second gate structures GL1C and GL2C may constitute fin field-effect transistors having different threshold voltages.

Figure 9:
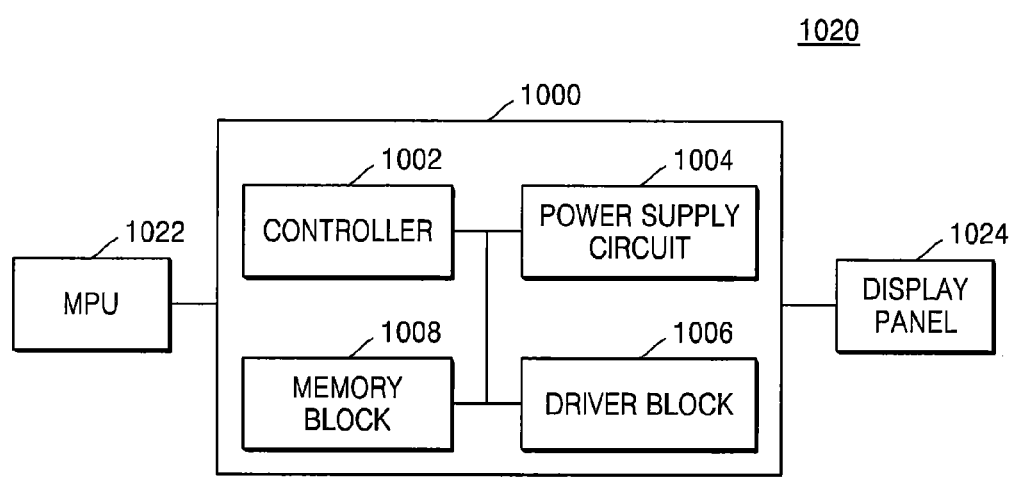
FIG. 9 is a block diagram of a display device driver (DDI) and a display device including the DDI according to some embodiments of the present inventive concept.

FIG. 9 is a block diagram of a display driver IC (DDI) 1000 and a display device 1020 including the DDI 1000, according to exemplary embodiments.

Referring to FIG. 9, the DDI 1000 may include a controller 1002, a power supply circuit 1004, a driver block 1006, and a memory block 1008. The controller 1002 may receive a command from a main processing unit (MPU) 1022, may decode the received command, and may control the driver block 1006 and the memory block 1008 of the DDI 1000 to implement an operation according to the received command. The power supply circuit 1004 may generate a driving voltage in respond to the control of the controller 1002. The driver block 1006 may drive a display panel 1024 by using the driving voltage generated by the power supply circuit 1004 in response to the control of the controller 1002. The display panel 1024 may be a liquid crystal display panel, a plasma display panel, or an organic light emitting diode (OLED) display panel. The memory block 1008 may be a block that temporarily stores a command input to the controller 1002 or control signals output from the controller 1002 or store a plurality of pieces of necessary data. The memory block 1008 may include a memory such as a RAM or a ROM. At least one of the power supply circuit 1004 and the driver block 1006 may include the integrated circuit devices 100, 100A, 100B, 100C, 100D, and 100E described with reference to FIGS. 1A to 8C, or may include at least one of modifications of the integrated circuit devices.

Figure 10:
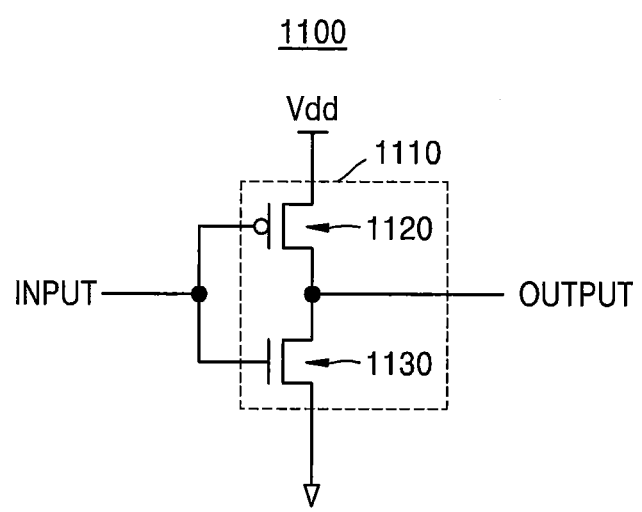
FIG. 10 is a circuit diagram of a CMOS inverter according to some embodiments of the present inventive concept.

FIG. 10 is a circuit diagram of a CMOS inverter 1100 according to exemplary embodiments.

Referring to FIG. 10, the CMOS inverter 1100 may include a CMOS transistor 1110. The CMOS transistor 1110 may include a PMOS transistor 1120 and an NMOS transistor 1130 which are connected to each other between a power supply voltage terminal Vdd and a ground voltage terminal. The CMOS transistor 1110 may include the integrated circuit devices 100, 100A, 100B, 100C, 100D, and 100E described with reference to FIGS. 1A to 8C, or may include at least one of modifications of the integrated circuit devices.

Figure 11:
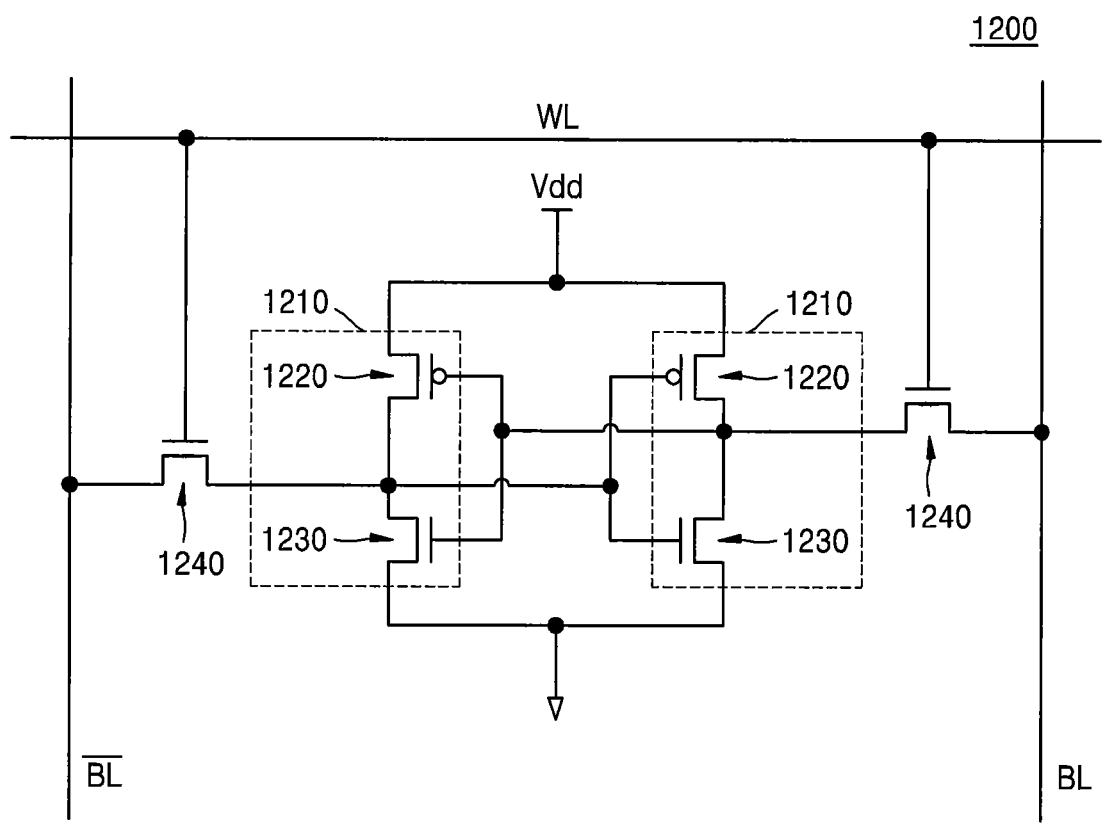
FIG. 11 is a circuit diagram of a CMOS SRAM device according to some embodiments of the present inventive concept.

FIG. 11 is a circuit diagram of a CMOS SRAM device 1200 according to exemplary embodiments.

Referring to FIG. 11, the CMOS SRAM device 1200 may include a pair of driving transistors 1210. Each of the pair of driving transistors 1210 may include a PMOS transistor 1220 and an NMOS transistor 1230 which are connected to each other between a power supply voltage terminal Vdd and a ground voltage terminal. The CMOS SRAM device 1200 may further include a pair of transfer transistors 1240. A source of the transfer transistor 1240 is cross-connected to a common node of the PMOS transistor 1220 and the NMOS transistor 1230 constituting the driving transistor 1210. The power supply voltage terminal Vdd is connected to a source of the PMOS transistor 1220, and the ground voltage terminal is connected to a source of the NMOS transistor 1230. A word line WL is connected to gates of the pair of transfer transistors 1240, and a bit line BL and a bit line bar BL are connected to drains of the pair of transfer transistors 1240, respectively.

At least one of the driving transistor 1210, and the transfer transistor 1240 in the CMOS SRAM device 1200 may include the integrated circuit devices 100, 100A, 100B, 100C, 100D, and 100E described with reference to FIGS. 1A to 8C, or may include at least one of modifications of the integrated circuit devices.

Figure 12:
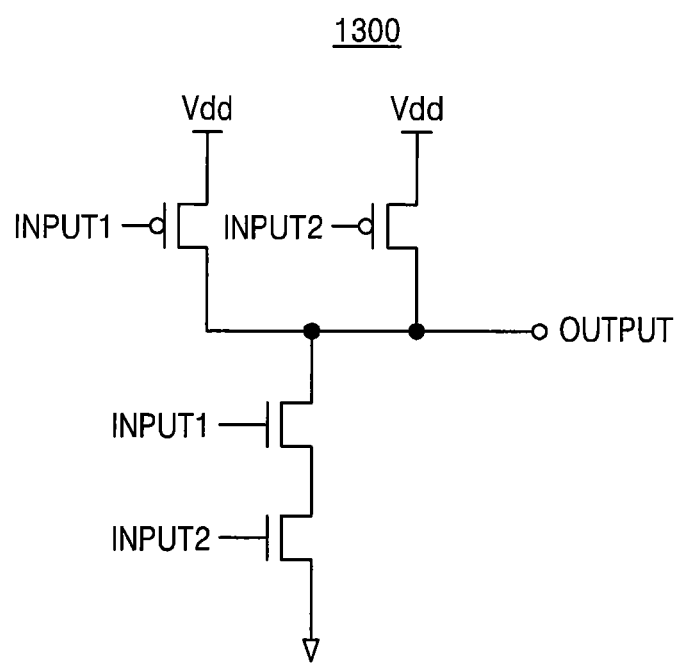
FIG. 12 is a circuit diagram of a CMOS NAND circuit according to some embodiments of the present inventive concept.

FIG. 12 is a circuit diagram of a CMOS NAND circuit 1300 according to exemplary embodiments.

Referring to FIG. 12, the CMOS NAND circuit 1300 may include a pair of CMOS transistors receiving different input signals. The CMOS NAND circuit 1300 may include the integrated circuit devices 100, 100A, 100B, 100C, 100D, and 100E described with reference to FIGS. 1A to 8C, or may include at least one of modifications of the integrated circuit devices.

Figure 13:
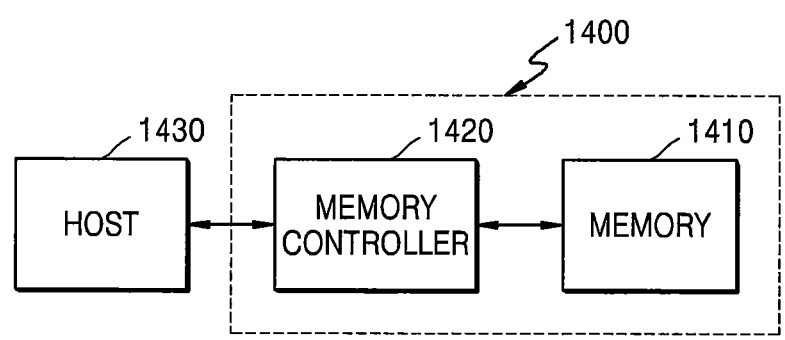
FIG. 13 is a block diagram of an electronic system according to some embodiments of the present inventive concept.

FIG. 13 is a block diagram of an electronic system 1400 according to exemplary embodiments.

Referring to FIG. 13, the electronic system 1400 may include a memory 1410 and a memory controller 1420. The memory controller 1420 may control the memory 1410 in response to a request from a host 1430 so as to read out data from the memory 1410 and/or write data in the memory 1410. At least one of the memory 1410 and the memory controller 1420 may include the integrated circuit devices 100, 100A, 100B, 100C, 100D, and 100E described with reference to FIGS. 1A to 8C, or may include at least one of modifications of the integrated circuit devices.

Figure 14:
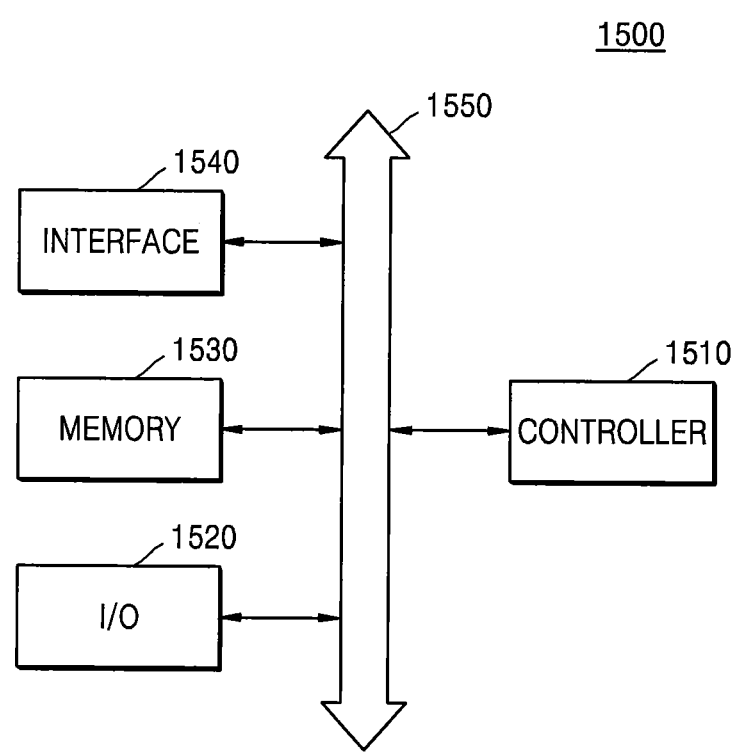
FIG. 14 is a block diagram of an electronic system according to some embodiments of the present inventive concept.

FIG. 14 is a block diagram of an electronic system 1500 according to exemplary embodiments.

The electronic system 1500 may include a controller 1510, an input/output (I/O) unit 1520, a memory 1530, and an interface 1540, which are connected to one another through a bus 1550.

The controller 1510 may include at least one of a microprocessor, a digital signal processor, and other similar processing devices. The I/O unit 1520 may include at least one of a keypad, a keyboard, and a display. The memory 1530 may be used to store a command executed by the controller 1510. For example, the memory 1530 may be used to store user data.

The electronic system 1500 may constitute a wireless communication device or a device capable of transmitting and/or receiving information under wireless environment. The interface 1540 may include a wireless interface to transmit/receive data through a wireless communication network in the electronic system 1500. The interface 1540 may include an antenna and/or a wireless transceiver. In some example embodiments, the electronic system 1500 may be used in a communication interface protocol of a third generation communication system such as a code division multiple access (CDMA), a global system for mobile communications (GSM), a north American digital cellular (NADC), an extended-time division multiple access (E-TDMA), and/or a wide band code division multiple access (WCDMA). The electronic system 1500 may include the integrated circuit devices 100, 100A, 100B, 100C, 100D, and 100E described with reference to FIGS. 1A to 8C, or may include at least one of modifications of the integrated circuit devices.

While the inventive concept has been particularly shown and described with reference to exemplary embodiments thereof, it will be understood that various changes in form and details may be made therein without departing from the spirit and scope of the following claims.

What is claimed is:

1. An integrated circuit device comprising:
    a substrate including first and second fin-type active regions;
    a first gate structure on the first fin-type active region, the first gate structure including:
        a first gate insulating layer on an upper surface and both side surfaces of the first fin-type active region;
        a first gate electrode on the first gate insulating layer, the first gate electrode having a first thickness in a first direction perpendicular to an upper surface of the substrate; and
        a second gate electrode on the first gate electrode; and
    a second gate structure on the second fin-type active region, the second gate structure including:
        a second gate insulating layer on an upper surface and both side surfaces of the second fin-type active region;
        a third gate insulating layer on the second gate insulating layer;
        a third gate electrode on the third gate insulating layer, the third gate electrode having a second thickness that is different from the first thickness in the first direction; and
        a fourth gate electrode on the third gate electrode,
    wherein a material of the first gate insulating layer is substantially different from a material of the third gate insulating layer.

2. The integrated circuit device of claim 1, wherein the first gate insulating layer directly contacts the first gate electrode and the third gate insulating layer directly contacts the third gate electrode.

3. The integrated circuit device of claim 1, wherein a difference between the first thickness of the first gate electrode and the second thickness of the third gate electrode is in a range of from about 0.1 nm to about 1.0 nm.

4. The integrated circuit device of claim 1, wherein the first gate electrode comprises substantially the same material as the third gate electrode, and wherein the first gate insulating layer comprises substantially the same material as the second gate insulating layer.

5. The integrated circuit device of claim 1:
    wherein a material of the first gate electrode is different from a material of the third gate electrode;
    wherein the first gate electrode comprises a first conductive material having a first impurity, the first impurity including a first component element forming the first gate insulating layer; and
    wherein the third gate electrode comprises a second conductive material having a second impurity, the second impurity including a second component element forming the third gate insulating layer.

6. The integrated circuit device of claim 1:
    wherein the first gate structure further comprises a first barrier metal layer between the first gate electrode and the second gate electrode; and wherein the second gate structure further comprises a second barrier metal layer between the third gate electrode and the fourth gate electrode.

7. The integrated circuit device of claim 1:
    wherein the first fin-type active region is a region for forming a first NMOS transistor having a first threshold voltage; and
    wherein the second fin-type active region is a region for forming a second NMOS transistor having a second threshold voltage that is different from the first threshold voltage.

8. The integrated circuit device of claim 1:
    wherein the first and second fin-type active regions extend in a second direction parallel to the upper surface of the substrate;
    wherein the first and second gate structures extend in a third direction parallel to the upper surface of the substrate and different from the second direction; and
    wherein the integrated circuit device further comprises:
        a first dummy gate structure spaced apart from the first gate structure on the first fin-type active region and extending in the third direction; and
        a second dummy gate structure spaced apart from the second gate structure on the second fin-type active region and extending in the third direction.

9. The integrated circuit device of claim 1, wherein the second thickness of the third gate electrode is less than the first thickness of the first gate electrode.

10. The integrated circuit device of claim 1, wherein the second thickness of the third gate electrode is substantially greater than the first thickness of the first gate electrode.

11. An integrated circuit device comprising:
    a substrate including first and second fin-type active regions;
    a first gate structure on the first fin-type active region, the first gate structure including:
        a first gate insulating layer on an upper surface and both side surfaces of the first fin-type active region;
        a first gate electrode on the first gate insulating layer; and
        a second gate electrode on the first gate electrode; and
    a second gate structure on the second fin-type active region, the second gate structure including:
        a second gate insulating layer on an upper surface and both side surfaces of the second fin-type active region;
        a third gate insulating layer on the second gate insulating layer;
        a third gate electrode on the third gate insulating layer; and
        a fourth gate electrode on the third gate electrode,
    wherein a material of the first gate insulating layer is substantially different from a material of the third gate insulating layer.

12. The integrated circuit device of claim 11, wherein the first gate electrode has a first thickness in a first direction perpendicular to an upper surface of the substrate, the third gate electrode has a second thickness in the first direction, and the second thickness is substantially different from the first thickness.

13. The integrated circuit device of claim 11:
    wherein the first gate insulating layer comprises substantially the same material as the second gate insulating layer.

14. The integrated circuit device of claim 11:
wherein a bottom surface of the first gate electrode is disposed at a level lower than a level of a bottom surface of the third gate electrode;
wherein the bottom surface of the first gate electrode vertically overlaps the upper surface of the first fin-type active region; and
wherein the bottom surface of the third gate electrode vertically overlaps the upper surface of the second fin-type active region.

15. The integrated circuit device of claim 11:
wherein a bottom surface of the first gate electrode is in contact with an upper surface of the first gate insulating layer; and
wherein a bottom surface of the third gate electrode is in contact with an upper surface of the third gate insulating layer.

16. An integrated circuit device comprising:
a substrate including first and second fin-type active regions;
a first gate structure on the first fin-type active region, the first gate structure including:
 a first gate insulating layer covering an upper surface and both side surfaces of the first fin-type active region; and
 a first gate electrode on the first gate insulating layer and having a first thickness in a first direction perpendicular to an upper surface of the substrate; and
a second gate structure on the second fin-type active region, the second gate structure including:
a second gate insulating layer covering an upper surface and both side surfaces of the second fin-type active region;
a third gate insulating layer covering the upper surface and both side surfaces of the second fin-type active region, with the second gate insulating layer disposed therebetween; and
a third gate electrode on the third gate insulating layer and having a second thickness that is different from the first thickness in the first direction,
wherein a material of the first gate insulating layer is substantially different from a material of the third gate insulating layer.

17. The integrated circuit device of claim 16, wherein a difference between the first thickness of the first gate electrode and the second thickness of the third gate electrode is in a range of from about 0.1 nm to about 1.0 nm.

18. The integrated circuit device of claim 16:
wherein a bottom surface of the first gate electrode is in contact with an upper surface of the first gate insulating layer; and
wherein a bottom surface of the third gate electrode is in contact with an upper surface of the third gate insulating layer.

19. The integrated circuit device of claim 16, wherein a bottom surface of the first gate electrode is disposed at a level lower than a level of a bottom surface of the third gate electrode.

20. The integrated circuit device of claim 16:
wherein the first gate electrode comprises a first conductive material having a first impurity, the first impurity having a first component element included in the first gate insulating layer; and
wherein the third gate electrode comprises a second conductive material having a second impurity, the second impurity having a second component element included in the third gate insulating layer.

* * * * *